US012736399B2

(12) United States Patent
Chandarana et al.

(10) Patent No.: US 12,736,399 B2
(45) Date of Patent: Sep. 15, 2026

(54) EMERGENCY LIGHT TESTING SYSTEM AND METHOD

(71) Applicant: ENERGY MANAGEMENT COLLABORATIVE, LLC, Plymouth, MN (US)

(72) Inventors: Aakash H. Chandarana, Minnetonka, MN (US); Ben P. Wright, Crystal, MN (US)

(73) Assignee: ENERGY MANAGEMENT COLLABORATIVE, LLC, Plymouth, MN (US)

( * ) Notice: Subject to any disclaimer, the term of this patent is extended or adjusted under 35 U.S.C. 154(b) by 0 days.

(21) Appl. No.: 18/573,164

(22) PCT Filed: Jun. 22, 2022

(86) PCT No.: PCT/US2022/034445
§ 371 (c)(1),
(2) Date: Dec. 21, 2023

(87) PCT Pub. No.: WO2023/278208
PCT Pub. Date: Jan. 5, 2023

(65) Prior Publication Data

US 2024/0295434 A1 Sep. 5, 2024

Related U.S. Application Data

(60) Provisional application No. 63/334,360, filed on Apr. 25, 2022, provisional application No. 63/216,453, filed on Jun. 29, 2021.

(51) Int. Cl.
*G01J 1/42* (2006.01)
*G01R 19/00* (2006.01)
(Continued)

(52) U.S. Cl.
CPC ........ *G01J 1/4204* (2013.01); *G01R 19/0084* (2013.01); *H05B 47/19* (2020.01); *H05B 47/172* (2024.01); *H05B 47/196* (2024.01)

(58) Field of Classification Search
CPC ... G01J 1/4204; G01R 19/0084; G01R 19/00; G01R 31/385; G01R 31/367; H02J 9/065;
(Continued)

(56) References Cited

U.S. PATENT DOCUMENTS 9,949,331 B1 * 4/2018 Coombes ............. H05B 47/199
2006/0139161 A1 * 6/2006 Beghelli ................ H05B 47/19 340/539.1
(Continued)

FOREIGN PATENT DOCUMENTS

SE 1650127 A1 8/2017
TW M606722 U 1/2021
WO WO-2010009781 A1 * 1/2010 ............. H05B 45/58

OTHER PUBLICATIONS

International Search Report and Written Opinion for PCT International Patent Application No. PCT/US22/34445 dated Jan. 26, 2023, 9 pages.
(Continued)

*Primary Examiner* — Monica T Taba
(74) *Attorney, Agent, or Firm* — Dorsey & Whitney LLP

(57) ABSTRACT

The present disclosure relates to a system for testing an emergency device comprising. In one example, the system includes a processing element configured to trigger a status condition of the emergency device. The processing element is further configured to receive status condition data and determine compliance data based on the detected status condition data. The system may transmit the compliance data. In one example, the status condition is a light output triggered by the interruption of power to the emergency
(Continued)

device. In another example, the status condition is a voltage of an emergency power supply of the emergency device.

14 Claims, 17 Drawing Sheets

(51) Int. Cl.
*H05B 47/17* (2020.01)
*H05B 47/175* (2020.01)
*H05B 47/19* (2020.01)

(58) Field of Classification Search
CPC ........... H02J 9/02; H05B 47/17; H05B 47/22; H05B 47/19; F21V 11/00; F21V 15/01; F21V 21/40; F21V 23/023; F21V 33/0076; G09F 13/04; G09F 2013/222
See application file for complete search history.

(56) References Cited

U.S. PATENT DOCUMENTS

2012/0126700 A1* 5/2012 Mayfield ................ G08B 7/062 315/86
2013/0157559 A1* 6/2013 Flammer, III ......... G08B 21/12 455/7
2013/0342342 A1* 12/2013 Sabre ...................... G09F 13/18 340/509
2014/0320011 A1* 10/2014 Hegarty ................ H02J 7/0068 315/132
2019/0027958 A1* 1/2019 Kuo ....................... H05B 47/20
2019/0281683 A1 9/2019 Liu et al.
2020/0066138 A1 2/2020 Lax

OTHER PUBLICATIONS

Extended European Search Report for European Patent Application No. 22833924.8 dated Apr. 14, 2025, 9 pages.

* cited by examiner

400

418

420

| NAME ⌄ | RESULTS ⌃ | TEST DATE | TEST DURATION ⌄ | | ⌄ |
|---|---|---|---|---|---|
| JANITOR CLOSET | PASS | 3/17/2021 11:36:59 | 30 SECONDS | HISTORY | ⌄ |
| JANITOR CLOSET | FAIL | 2/19/2021 1:02:03 | 120 SECONDS | HISTORY | ⌃ |
| SCHEDULED ANNUAL TEST RESULTS: LAMP 3 FAILED<br>EMERGENCY LIGHT WITH TWO LAMPS<br>BATTERY PART NUMBER: 3.6V<br>START BATTERY: 4.2(V) – END BATTERY: 4.0(V) | | | | | |
| CENTER HALL | PASS | 3/17/2021 11:36:59 | 30 SECONDS | HISTORY | ⌄ |
| CENTER HALL | PASS | 3/15/2021 23:59:29 | 5400 SECONDS | HISTORY | ⌄ |
| TRAINING PATIO | PASS | 3/17/2021 11:36:58 | 30 SECONDS | HISTORY | ⌄ |
| TRAINING PATIO | PASS | 3/15/2021 23:59:29 | 5400 SECONDS | HISTORY | ⌄ |

EMERGENCY LIGHT TESTING SYSTEM AND METHOD

CROSS-REFERENCE TO RELATED APPLICATIONS

The present application is the national stage application of International Patent Application No. PCT/US2022/034445 filed on Jun. 22, 2022 and entitled "Emergency Light Testing System and Method", which claims priority to U.S. Provisional Patent Application No. 63/216,453, filed on Jun. 29, 2021 and entitled "Emergency Light Testing System and Method" and to U.S. Provisional Patent Application No. 63/334,360, filed on Apr. 25, 2022 and entitled "Emergency Light Testing System and Method", all of which are incorporated by reference in their entireties.

FIELD

The present disclosure relates generally to devices and methods for testing emergency lighting devices.

BACKGROUND

Emergency lights are important public safety devices. Emergency lights may include lighted signage such as an exit sign, egress path lighting, or combinations thereof also called combo lights (collectively "emergency lighting devices"). Emergency lighting systems illuminate critical pathways and provide signage to exits that lead out of a building and/or to safe areas within a building. Emergency lights may be continuously lighted or may illuminate in response to an exigent circumstance such as a power outage, fire alarm, or other emergency situation. Regulatory requirements defined by the International Building Code (IBC), National Fire Protection Association (NFPA), and many state regulations require many building owners to have emergency lighting devices.

The regulatory requirements govern the operation, performance, and placement of emergency lighting devices. The requirements specify the placement of emergency lighting devices at exits or pathways leading to a public way, exits, as well as rooms critical in building operations (e.g., electrical rooms, fire command centers, generator rooms, etc.). The regulatory requirements also specify illumination levels, the number of signs, the number of lights, fonts for signs, the size of signs, and proximity of lights and signs to exit paths.

Regulatory requirements also mandate regular testing and/or inspection of emergency lighting systems to assure proper operation and functionality. Emergency lights and exit signs often use an emergency power source, such as a battery or generator, to function when routine sources of power (e.g., line voltage, building power, and alternating current ("AC") power) are unavailable such as due to a power outage. Emergency lights often include a charging circuit that charges the emergency power source while the routine power source is available. Regular testing assures that the emergency lighting system is functional. For example, regular testing assures that the emergency power source, its charging circuit, sensors that turn the lights on, and the lights themselves function as required.

An example testing schedule may require each light to be tested for 30 seconds each month every 3-5 weeks and/or 90 minutes annually. Regulations often require the building owner to keep and be prepared to present, on demand, reports demonstrating the regular testing of each of the building's emergency lighting systems. A single building can have tens, hundreds, or thousands of emergency lighting systems subject to this labor intensive compliance process of testing, inspecting, recording test results, and maintaining records. A building owner may have multiple buildings subject to compliance as well. Traditionally, each emergency lighting system is manually tested by a person who goes to the location of the light, pushes a button on the light to cause it to enter a test mode, waits the required time noting the light's response, and record the response. Emergency lighting system compliance, while critical to life safety, is financially burdensome, subject to fraud (e.g., workers or owners who do not want to invest the resources to comply and then falsify records), imprecise (e.g., a worker has no way of measuring light output compared to a standard or requirement), and time consuming. With many millions of installed emergency lighting systems, there is a strong need for improved compliance solutions. Further, with millions of existing emergency lighting systems, there is a strong need for a solution that can be retrofitted to existing emergency lighting systems to ease compliance.

BRIEF SUMMARY

A system for testing an emergency lighting device is disclosed. In some embodiments the system includes a node couplable to a housing of the emergency lighting device, the node including a processing element configured to: trigger a status condition of the emergency device; receive status condition data; determine compliance data based on the received status condition data; and transmit the compliance data.

Optionally, in some embodiments, the node includes a network interface configured to transmit the compliance data.

Optionally, in some embodiments, the node is in electrical communication with a sensor configured to detect the status condition and generate the status condition data.

Optionally, in some embodiments, the status condition includes a light output from a light source of the emergency device; and the sensor is a light sensor disposed relative to the light source and is configured to detect the light output of the light source and generate the status condition data based on the detected light output.

Optionally, in some embodiments, the light source comprises one of an egress light or a signage light.

Optionally, in some embodiments, the emergency lighting device includes an emergency power source enclosed in the housing; the status condition includes a voltage output from the emergency power source; and the sensor is a voltage sensor in electrical communication with the emergency power source, the voltage sensor configured to detect a voltage of the emergency power source and generate the status condition data based on the detected voltage.

Optionally, in some embodiments, the emergency power source comprises at least one of a battery or a generator.

Optionally, in some embodiments, the node further includes a first test switch in electrical communication with the processing element and configured to interrupt a supply of electrical power to the emergency device to trigger the status condition.

Optionally, in some embodiments, the first test switch is a normally-closed switch.

Optionally, in some embodiments, the node includes a second test switch in electrical communication with the processing element and configured to selectively electrically connect an emergency power source of the emergency device to the processing element.

Optionally, in some embodiments, the second test switch is a normally open switch.

Optionally, in some embodiments, the node is one of a plurality of nodes, and wherein each node is associated with an emergency device.

Optionally, in some embodiments, the plurality of nodes forms a local network operative to transmit the compliance data.

Optionally, in some embodiments, the local network is a mesh network.

Optionally, in some embodiments, the mesh network is a flooded mesh network.

Optionally, in some embodiments, the local network is a Bluetooth network.

Optionally, in some embodiments, the system includes a gateway in communication with the local network and operative to receive the transmitted compliance data from the node.

Optionally, in some embodiments, the gateway is operative to transmit a command to the node, wherein the command causes the processing element of the node to trigger the status condition.

Optionally, in some embodiments, the local network is a start network.

Optionally, in some embodiments, the network communicates at a frequency below 1-GHz.

A method of testing an emergency device is disclosed. In some embodiments the method includes: coupling a node to a housing of the emergency lighting device, wherein the node includes a processing element; interrupting, by the processing element, a routine power supply to the emergency device; monitoring, by the processing element, a first status condition generated in response to the interruption of the routine power supply; restoring, by the processing element, the routine power supply; and determining, by the processing element, compliance data based on the monitored first status condition.

Optionally, in some embodiments, the method further includes monitoring, by the processing element, a second status condition generated in response to the interruption of the routine power supply.

Optionally, in some embodiments, the first status condition or the second status condition is one of a light output, a voltage, or a sound.

Optionally, in some embodiments, the method further includes determining an operational state of one of an emergency power supply or a charging circuit of the emergency device based on the monitored first status condition.

Optionally, in some embodiments, the method further includes transmitting, by the processing element, the compliance data.

Optionally, in some embodiments, the compliance data is transmitted by a mesh network.

A node coupled to an emergency lighting device is disclosed. In some embodiments the node includes a non-transitory computer-readable storage medium, the computer-readable storage medium including instructions that when executed by a processing element, cause the processing element to: interrupt a routine power supply to an emergency device; monitor a first status condition generated in response to the interruption of the routine power supply; restore the routine power supply; and determine compliance data based on the monitored first status condition.

A system for testing an emergency lighting device is disclosed. In some embodiments the system includes a node including: a node housing coupled to a main housing of the emergency lighting device; a processing element disposed in the node housing; a first test switch operatively controlled by the processing element, the first test switch configured to selectively interrupt a routine power source to the emergency device. The interruption of the routine power source causes the emergency device to illuminate a light source; a light sensor in electrical communication with the processing element, the light sensor disposed within an emissive range of the light source such that the light sensor detects a light output of the illuminated light source. The light sensor generates a first status condition data of the illuminated light source; wherein the emergency lighting device includes the main housing formed of a plurality of walls, wherein the plurality of walls form an internal compartment; an emergency power source disposed in the internal compartment; a charging circuit disposed in the internal compartment and in electrical communication with the emergency power source and configured to charge the emergency power source from a routine power source; a light source in electrical communication with the emergency power source and configured to illuminate responsive to a loss of the routine power source, the system.

Optionally, in some embodiments the system includes a voltage sensor in electrical communication with the processing element, a second test switch operatively controlled by the processing element, the second test switch configured to selectively electrically connect an emergency power source of the emergency device to the voltage sensor, wherein the voltage sensor generates a second status condition data of the emergency power source.

Optionally, in some embodiments the processing element is configured to determine compliance data based on at least one of the first status condition data or the second status condition data.

Optionally, in some embodiments the system further includes: a first wireless interface in communication with the processing element, the wireless interface configured to form a mesh network with a second wireless interface in electrical communication with a second processing element.

Optionally, in some embodiments the processing element is configured to transmit the compliance data by the first wireless interface to the second processing element via the mesh network.

Optionally, in some embodiments the system further includes a third test switch operatively controlled by the second processing element, the third test switch configured to selectively interrupt a second routine power source to a second emergency device, wherein the interruption of the second routine power source causes the second emergency device to illuminate a second light source; a second light sensor in electrical communication with the second processing element, the second light sensor disposed within an emissive range of the second light source such that the second light sensor detects a light output of the illuminated second light source, wherein the second light sensor generates a first status condition data of the illuminated second light source.

Optionally, in some embodiments the system further includes a gateway including the second processing element and the second wireless interface, wherein the gateway is configured to receive at least one of the first status condition data, the second status condition data, and the compliance data.

Optionally, in some embodiments the gateway is configured to manage the mesh network.

Optionally, in some embodiments the system further includes a second light sensor in electrical communication with the processing element, the second light sensor disposed within an emissive range of a second light source. The second light source is disposed within a main housing of the emergency device, the second light sensor detects a light output of the illuminated second light source, and the second light sensor generates a first status condition data of the illuminated second light source.

Optionally, in some embodiments the emergency device comprises signage and the second light source is configured to illuminate the signage.

Optionally, in some embodiments the system further includes an electrical enclosure coupled to the main housing and to the node housing, wherein the node housing is coupled to the main housing by the electrical enclosure.

Optionally, in some embodiments the electrical enclosure is coupled to a top wall of the main housing and the node housing is coupled to the electrical enclosure.

Optionally, in some embodiments the node housing extends laterally from the electrical enclosure.

Optionally, in some embodiments the node housing is disposed above the main housing and below a ceiling to which the main housing is mounted.

Optionally, in some embodiments one or more external wires that provide the electrical communication between the light sensor and the processing element are disposed above the main housing.

Optionally, in some embodiments the light sensor is positioned in the emissive range of the light source by the wire.

Optionally, in some embodiments the wire is coupled to the main housing by a clip.

Optionally, in some embodiments the clip further positions the sensor in the emissive range of the light source.

Optionally, in some embodiments the electrical enclosure is coupled to a rear wall of the main housing and the node housing is coupled to the electrical enclosure.

Optionally, in some embodiments the node housing extends above the electrical enclosure.

Optionally, in some embodiments the node housing is disposed behind the main housing and in front of a wall to which the main housing is mounted.

Optionally, in some embodiments the emergency lighting device is coupled to a mounting plate including a conduit interface; the mounting plate is coupled to a wall; the node housing is coupled to the conduit interface and is disposed above the emergency lighting device.

Optionally, in some embodiments the emergency lighting device is configured to be received in a ceiling section formed by a plurality of intersecting ribs, wherein: the emergency lighting device is received in a first ceiling section and the node is received in a second ceiling section.

Optionally, in some embodiments the first ceiling section is adjacent to the second ceiling section.

Optionally, in some embodiments the first ceiling section is spaced apart from the second ceiling portion by a third ceiling portion.

Optionally, in some embodiments the node is electrically coupled to an antenna and the antenna is received in the second ceiling section; the node housing is coupled to a first portion of the emergency lighting device; and the antenna is coupled to a second portion of the emergency lighting device.

A system for testing an emergency lighting device is disclosed. In some embodiments, the system includes a node including: a node housing retrofittable to a main housing of the emergency lighting device; a processing element disposed in the node housing; and a light sensor in electrical communication with the processing element, wherein the emergency lighting device includes an emergency power source and a light source received in the main housing, and wherein the light sensor is positionable on an external surface of the main housing of the emergency lighting device within an emissive range of the light source such that the light sensor detects a light output of the illuminated light source, wherein the light sensor generates a first status condition data of the illuminated light source.

Optionally, in some embodiments the system includes a first test switch operatively controlled by the processing element, the first test switch configured to selectively interrupt a routine power source to the emergency device, wherein the interruption of the routine power source causes the emergency device to illuminate the light source.

Optionally, in some embodiments the system includes a first test switch operatively controlled by the processing element, the first test switch configured to selectively interrupt the routine power source to the emergency device, wherein the interruption of the routine power source causes the emergency device to illuminate the light source.

Optionally, in some embodiments the system includes a voltage sensor in electrical communication with the processing element, a second test switch operatively controlled by the processing element, the second test switch configured to selectively electrically connect the emergency power source of the emergency device to the voltage sensor, wherein the voltage sensor generates a first status condition data of the emergency power source.

BRIEF DESCRIPTION OF THE SEVERAL VIEWS OF THE DRAWINGS

FIG. 11 illustrates an example of a user interface of a gateway of the emergency light testing system of FIG. 1.

DETAILED DESCRIPTION

Figure 1:
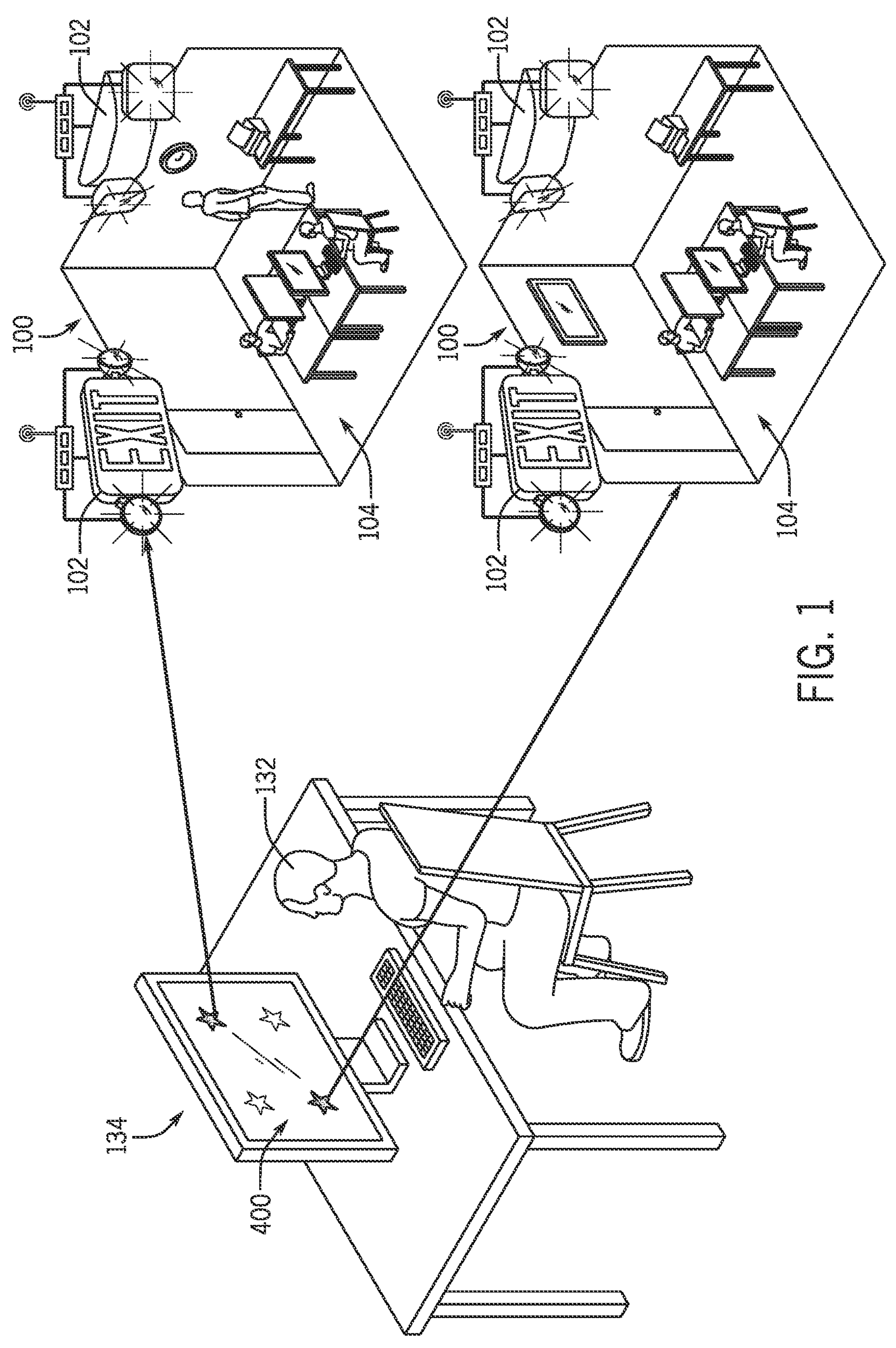
FIG. 1 illustrates a schematic view of an emergency light testing system in use with one or more buildings.

With reference to FIG. 1 one or more buildings 104 are shown including one or more emergency lighting devices 102. The emergency lighting devices 102 may be exit signs, combo lights, egress lights, or the like. An emergency light testing system 100 is installed with the emergency lighting devices 102. In one example, the emergency light testing system 100 may include a server 134. The server 134 can initiate testing of the emergency lighting devices 102 in the buildings 104 via one or more nodes 118 of the emergency light testing systems 100. The server 134 can receive results from testing of the emergency lighting devices 102 by the nodes 118. For example, the server 134 may present a user interface 400 that enables a user 132 to review test logs of past tests of the emergency lighting devices 102, initiate and/or schedule new tests, and/or check status of either individual emergency lighting devices 102, groups of emergency lighting devices 102, all the emergency lighting devices 102 associated with a building 104, or all the emergency lighting devices 102 associated with any or all of the buildings 104. The server 134 may be located remotely from the buildings 104, or may be in one of the buildings 104.

Figure 2A:
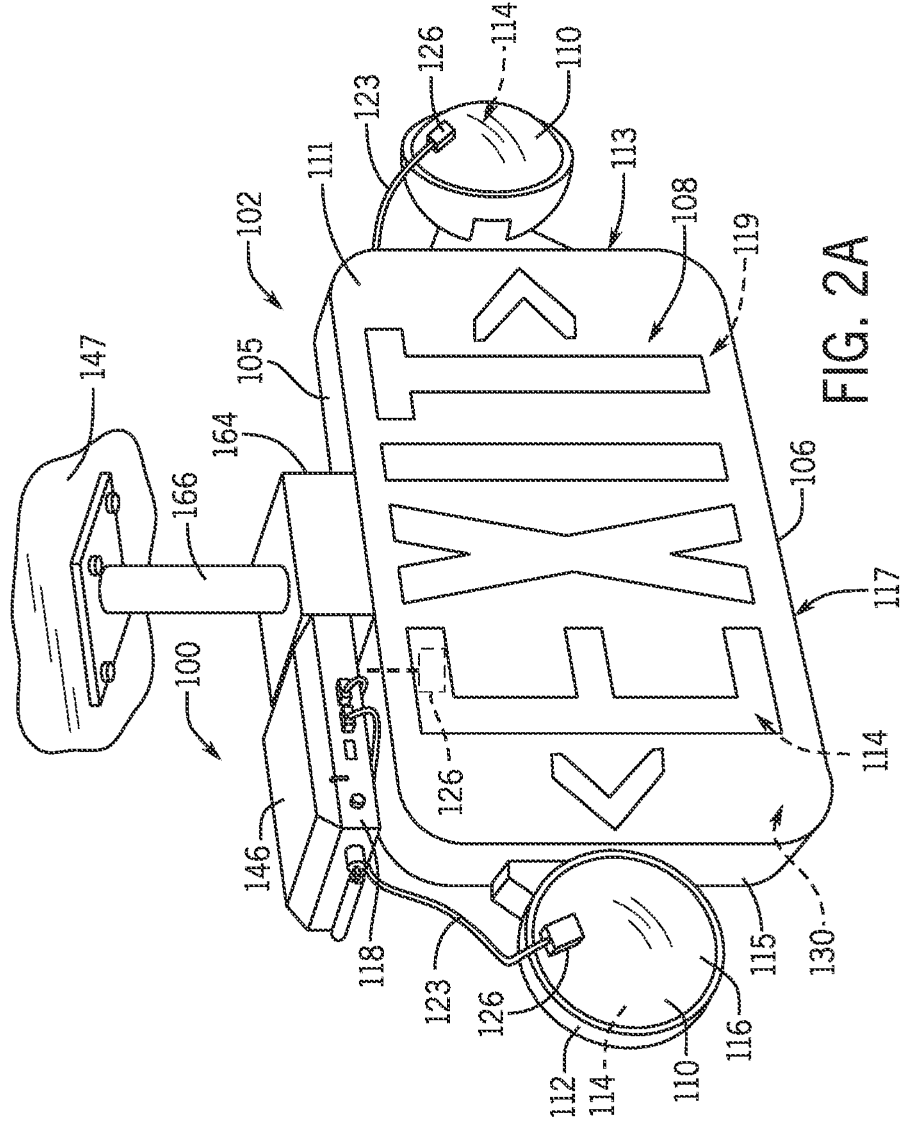
FIG. 2A illustrates a front isometric view of a node of the emergency light testing system of FIG. 1 installed with an emergency lighting device.

With reference to FIG. 2A, an example of an emergency lighting device 102 is shown with a node 118 of the emergency light testing system 100. The node 118 may be suitable for retrofitting to an existing emergency lighting device 102. The emergency lighting device 102 may include a main housing 106 that contains internal components of the emergency lighting device 102. The main housing 106 may include a plurality of walls. For example, the main housing 106 may have a top wall 105, a rear wall 107, a front wall 111, a right wall 113, a left wall 115, and a bottom wall 117. Two or more of the respective walls may intersect one another at one or more edges or corners. The walls may form an internal compartment 119 that encloses the components of the emergency lighting device 102. For example, the internal compartment 119 may enclose one or more light sources 114, an emergency power source 130, and an emergency circuit suitable to illuminate the one or more light sources 114 using power from the emergency power source 130 when a routine power source such as mains power is not available. One or more walls may be removable, such as the front wall 111 or the rear wall 113. The main housing 106 may have an ingress protection rating suitable for placement indoors or outdoors.

The housing 106 may be coupled to an electrical enclosure 164 such as a junction box that facilitates wiring of the emergency lighting device 102 to the building. For example, the electrical enclosure 164 may house wiring splices that connect the emergency lighting device 102 to the routine power source of the building (e.g., mains or 120/240V power or the like). The electrical enclosure 164, the node 118 and the emergency lighting device 102 may be supported by a conduit 166. The conduit 166 may also carry wiring between the emergency lighting device 102 and/or the node 118 and the building.

In some examples, a node 118 may be received or enclosed in an electrical enclosure 164. In some implementations when the node 118 is enclosed in the electrical enclosure, the node 118 may make use of a base 179 and remote antenna 176 (discussed in more detail with respect to FIG. 5) placed outside the enclosure 167. Such an implementation may have the benefit of placing the node 118 in the electrical enclosure 164 (e.g., for security, retrofitability, and/or aesthetic reasons), while enabling the node 118 to communicate with a network via the remote antenna 176.

The housing 106 may form, include, or be coupled to signage 108. For example, the signage 108 may include an indication of an egress location from the building 104 such as an exit door, fire escape, stairs, or the like. For example, the signage may include the word "EXIT" in any suitable language. In another example, the signage 108 may include an icon or the like of a person exiting the building 104. The signage 108 may indicate a safe location of the building 104 such as a tornado shelter, fallout shelter, safe room, or the like. The signage 108 may indicate a location of a critical building system such as a fire control center, generator room, or the like. The signage 108 may include one or more directional indicators (e.g., one or more arrows) indicating a direction from the emergency lighting device 102 toward the exit or other safe or critical location. The signage 108 may include a translucent or transparent material through which light from a light source inside the housing 106 is able to pass. The translucent material may be colored (e.g., green, red, amber, or the like) to change or filter the hue of the light emitted by the light sources in the housing 106.

Figure 2B:
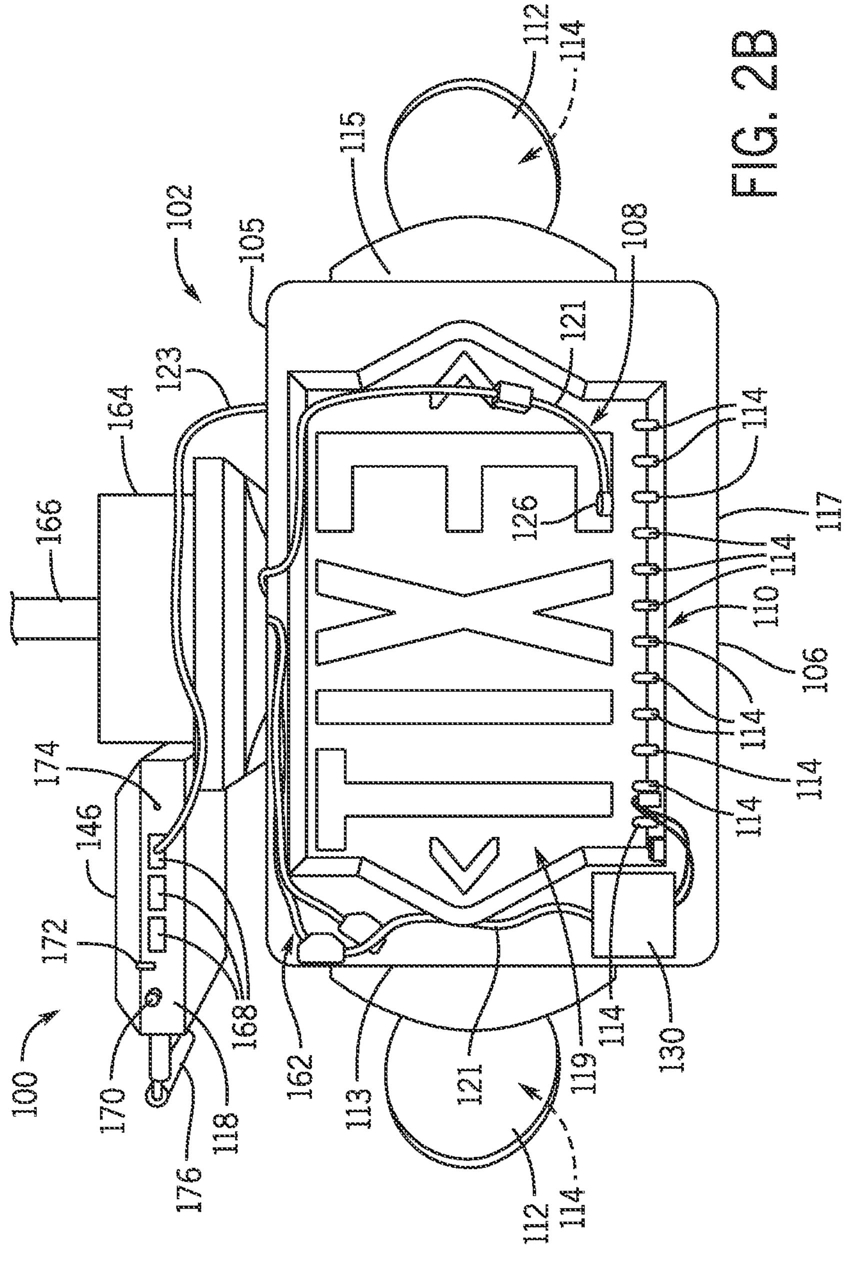
FIG. 2B illustrates a simplified rear view of the node and the emergency lighting device of FIG. 2A, with a portion of the emergency lighting device removed.

As shown for example in FIG. 2B, in many embodiments, the signage 108 is lighted with a light source 114. As used herein, a light source may be substantially any device that emits electromagnetic radiation in a wavelength band visible to humans. For example, a light source 114 may be an incandescent lamp, fluorescent lamp, an arc lamp (such as a high intensity discharge lamp), a neon lamp, a sodium or mercury vapor lamp, a light emitting diode, or the like. In some examples, a light source 114 may be a radioluminescent source including a radioisotope (e.g., tritium) in combination with a luminescent substance that emits light when interacting with particles or radiation emitted from the radioisotope.

The emergency lighting device 102 may include one or more light assemblies 110 that include one or more light sources 114. The light assemblies 110 may include a light assembly housing 112 that contains a light source 114. The light assembly housing 112 may be coupled to the main housing 106 of the emergency lighting device 102. A lens 116 may be disposed over the light source 114 such as to focus or direct the light from the light source 114. In some embodiments, an emergency lighting device 102 may include a sound generator device such as a speaker, buzzer, horn, claxon, or the like.

In many embodiments, the emergency lighting device 102 includes an emergency power source 130 such as a battery, capacitor, dedicated emergency power supply circuit, or the like that provides electrical power to the emergency lighting device 102 when the emergency lighting device 102 is in an emergency operation mode. An emergency operation mode may occur when the main supply of power (e.g., an AC power source such as a 120V-277 V building power source) to the emergency lighting device 102 is deactivated, removed, or otherwise lost. In the emergency operation mode, the emergency lighting device 102 may illuminate one or more light sources 114 using power from the emergency power source 130. Some types of emergency lighting devices 102 have and emergency power source 130 supplied by centralized building emergency power source 130 such as a generator or backup batteries. Some types of emergency lighting devices 102 ("switched emergency lights") may be switchable on or off as desired such as by a wall switch, yet will illuminate in an emergency situation such as the loss of building power. Switched emergency lights may include a local emergency power source 130 that powers an inverter or other converted to convert DC power to AC power to power the light source 114 therein.

The emergency light testing system 100 is coupled to a node 118, such as may have been added to the emergency lighting device 102 by a retrofit operation. In some embodiments, the node 118 may be coupled directly to the housing 106 of the emergency lighting device 102. In some embodiments, the node 118 may be coupled to the electrical enclosure 164. The electrical enclosure 164 may be coupled to any wall of the main housing 106. For example, as shown, in FIG. 2A, the electrical enclosure is coupled to the top wall 105 of the housing 106. The electrical enclosure may include one or more knock-out panels that can be removed to enable access to and connection of the node 118 to the electrical enclosure 164. In many examples, a node 118 may be added to an existing emergency lighting device 102 without decoupling the lighting device from the electrical enclosure 164. The node housing 146 may include a connector 175 that couples the node 118 to a conduit interface 177 of the electrical enclosure 164 (see, e.g., FIG. 3B). For example, the node housing 146 may include a threaded collar connector 175 suitable for use with standard electrical junction boxes. Thus, the node 118 may be retrofitted to an emergency lighting device 102. The node 118 may couple to the electrical enclosure 164 at a location such that the node 118 does not obscure the signage 108 or the light assembly 110. For instance, the node 118 may be located above the signage 108, beside the signage, behind the signage, or below the signage.

As shown for example in FIG. 2B, the emergency lighting device 102 is shown with a rear wall 107 removed to illustrate the internal components thereof. The emergency lighting device 102 includes a light assembly 110 with a plurality of light sources 114. As discussed herein, the light sources 114 may be LEDs or other light sources. The light assembly 110 may be powered by a routine power source 162 such as mains power. The light assembly 110 may also be powered by an emergency power source 130, such as a battery, when the routine power source 162 is not available.

The node 118 may include a node housing 146 that contains the components of the node 118. In the example shown in FIGS. 2A and 2B, the node housing 146 is coupled to the electrical enclosure 164 to which the emergency lighting device 102 is coupled, such as in a retrofit implementation of the emergency light testing system 100. In other embodiments, the node 118 is integrated with the emergency lighting device 102, such that the components of the node 118 are packaged in the main housing 106 of the emergency lighting device 102. The node 118 is in electrical communication with one or more sensors 126 suitable to detect a status condition of the emergency lighting device 102. A status condition may include the illumination of one or more light sources 114, the generation of a sound, or a voltage of an emergency power source 130 operative to power the emergency lighting device 102 in an emergency mode. In many embodiments, a sensor 126 is a light sensor. As used herein a light sensor is any device that can convert incident electromagnetic radiation into a signal that can be detected by a processing element 150 or similar device. For example, a sensor 126 may be a photo resistor such as a cadmium sulfide ("CdS") photocell, a photodiode, and/or a phototransistor. In some examples, an electrical signal generated by a sensor 126 is a signal that becomes more intense the greater the light output detected by the sensor 126. In some examples, an electrical signal generated by a sensor 126 is a signal that becomes less intense the greater the light output detected by the sensor 126 (e.g., a CdS photo cell whose resistance increases with light output detected). In some embodiments, the sensor 126 generates a digital signal that increases or decreases with the light output. As used herein, light output means: radiant flux (i.e., the directed angular density of radiation from a light source 114 for example measured in units of Watts per steradian); radiant intensity (i.e., the total radiant power emitted from a light source 114 or received by a surface for example measured in units of Watts); irradiance (i.e., the radiant flux incident on an object's surface for example measured in units of Watts per square meter); radiance (i.e., the total radiant intensity per unit projected area for example measured in Watts per square meter-steradian); any other suitable radiometric measurement; and/or any of these values over time. Other types of sensors may be used, to provide additional functionality. For example, a sensor 126 may be a temperature sensor, humidity sensor, carbon dioxide sensor, carbon monoxide sensor, smoke sensor, ionization sensor, pyroelectric infrared sensor, light detection and ranging ("LIDAR"), radio detection and ranging ("RADAR"), gunshot detection sensor, or the like.

The node housing 146 includes access apertures suitable to provide access to one or more electrical connectors 168. The electrical connectors 168 may be suitable to electrically connect to the one or more sensors 126. Some electrical connectors may be accessible externally through the node housing 146 (i.e., accessible when the node 118 is installed with an emergency lighting device). Some electrical connectors 168 may be accessible via an internal connection (i.e., accessible via the connector 175, but generally enclosed by the node housing 146).

As shown for example in FIGS. 2A and 2B, the node housing 146 may be coupled to the electrical enclosure 164. The electrical enclosure 164 may be coupled to the main housing 106. For example, the electrical enclosure 164 may be coupled to the top wall 105, the left wall 115, the right wall 113, or the rear wall 107 of the main housing 106. The node housing 146 may be disposed above the main housing 106 of the emergency lighting device 102. The node housing 146 may extend laterally from the electrical enclosure 164. The node housing 146 may have a low profile shape and/or size that can enable the node 118 to be placed between the emergency lighting device 102 and a support structure 147 such as a ceiling, wall, or other structure that supports the emergency lighting device 102. For example, the node 118 may be disposed above the emergency lighting device 102 and below the ceiling 147. A low profile shape/size may be advantageous to enable the use of the node 118 in a retrofit application, such that the node 118 can be coupled to the emergency lighting device 102 without repositioning the emergency lighting device 102.

Coupling the node housing 146 to the electrical enclosure 164 may have a benefit of enabling the passage of wiring between the node 118 and the emergency lighting device 102 through the electrical enclosure. In this example, the wiring can access internal components of the emergency lighting device 102 (e.g., a light assembly 110, emergency power source 130, routine power source 162, or the like). For example, as shown in FIG. 2B, one or more internal wires 121 (e.g., wires that pass between the node and the emergency lighting device 102 and enclosed in the main housing 106, the node housing 146, the electrical enclosure 164, and/or another structure) may pass from the node 118, through the internal compartment of the electrical enclosure 164, and into the main housing 106 of the emergency lighting device 102. The internal wires 121 may electrically connect a sensor 126 to the node 118. The internal wire 121 may provide electrical communication between the sensor 126 and/or the emergency power source 130 and the processing element 150 of the node 118. The internal wires 121 may position the sensor 126 within the main housing 106 within the emissive range of a light assembly 110, such that the sensor can detect light output from the light assembly 110. Similarly, one or more internal wires 121 may electrically connect a voltage sensor of the node 118 to the emergency power source 130.

Placing the node housing 146 above the main housing 106, may enable the passage of one or more external wires 123 (e.g., wires that pass between the node 118 and the emergency lighting device 102 on the outside of the main housing 106, node housing 146, and/or the electrical enclosure 164) along the outside of top wall 105 of the emergency lighting device 102 between the node 118 and a light assembly of the emergency lighting device 102. For example, as shown in FIG. 2A, an external wire 123 may electrically connect a sensor 126 to the node 118 via an electrical connector 168. The external wire 123 may provide electrical communication between the sensor 126 and the processing element 150 of the node 118. The external wire 123 may extend along the outside of the top wall 105, the right wall 113, and/or the left wall 115 between the node 118 and the light assembly 110. The external wire 123 may position a sensor 126 outside the main housing 106 in the emissive range of the light source 114 of the light assembly 110, such that the sensor 126 can detect light emitted from the light source 114. The disposition of the node 118 above the emergency lighting device 102 may enable the positioning of external wire 123 where it is out of reach of occupants of the building. For example, the external wires 123 may be disposed above portions of the main housing 106 such that casual passers-by will be unable to reach and/or tamper with the wiring. Yet, the external wire 123 may be accessible to service personnel, such as through the use of a ladder.

The node 118 may include an indicator 172, such as an LED or other light source visible through the node housing 146. The indicator 172 may transmit a status of the node 118. For example, the indicator 172 illuminate with a colored light that indicates normal status (e.g., green). The indicator 172 may illuminate with a colored light that indicates an abnormal status (e.g., red). The indicator 172 may blink, flash, pulsate, or the like to indicate status, such as that communication is in progress, a lighting test is in progress, a status of a lighting test (e.g., pass or fail), that the node is being configured, or the like. The node 118 may include a tactile input 170 such as a button or switch. The tactile input 170 may be suitable to reset, configure, power, or depower the node 118. The node 118 may include a service input 174. The service input 174 may be a switch, button, or the like that is protected from accidental activation by being enclosed in the node housing 146. The service input 174 may be accessible through an aperture in the node housing 146 by a service tool such as a pin, magnet, screwdriver, or the like. The service input 174 may be suitable to perform a factory reset of the node 118 to default or safe settings and may aid in troubleshooting a node 118. The node 118 may include an antenna 176. In some embodiments, the antenna 176 may be supported by the node housing. In some embodiments, the antenna 176 may be a remote antenna supported by a structure other than the node housing 146, such as a portion of the main housing 106. The antenna 176 may be internal to the node housing 146 or may be external. The antenna 176 is in electrical communication with a network interface 156 of the node 118 and suitable to enable the node 118 to communicate to other devices (e.g., other nodes 118, a gateway 136, a server 134, and/or a user device 142 via a network 140 and/or a local network 128. The antenna 176 may include a swivel and/or pivot to enable the antenna 176 to be positioned to better connect to a network.

In many embodiments, the one or more sensors 126 are disposed in respective locations to the light sources 114 such that the one or more sensors 126 may detect light emitted by the respective light source 114. For example, the one or more sensors may be disposed in an emissive range of the light source 114. For example, a sensor 126 may be placed over a portion of a lens 116 of a light assembly 110 (see, e.g., FIG. 2A). The active portion of the sensor 126 may be placed facing into the light assembly 110. The sensor 126 may be secured to the light assembly 110 by an adhesive, a hook and loop fastener, a clip, wire, fastener (such as a screw, bolt, or nut), bale, or other suitable device. In other embodiments, one or more sensors 126 may be disposed inside light assembly 110. Similarly, a sensor 126 may be disposed in relation to a light source 114 inside the main housing 106 (e.g., the light source 114 that lights the signage). For example, a sensor 126 may be placed in proximity to a light source 114 internal to the main housing 106 of the emergency lighting device 102 (see, e.g., FIG. 2B). In some embodiments, one or more sensors 126 may be disposed on or near the outside of the main housing 106 or the light assembly housing 112. Thus, the node 118 may be beneficial in retrofitting an existing emergency lighting device 102 with an emergency light testing system 100 with minimal disruption to the emergency lighting device 102.

Figures 3A, 3B:
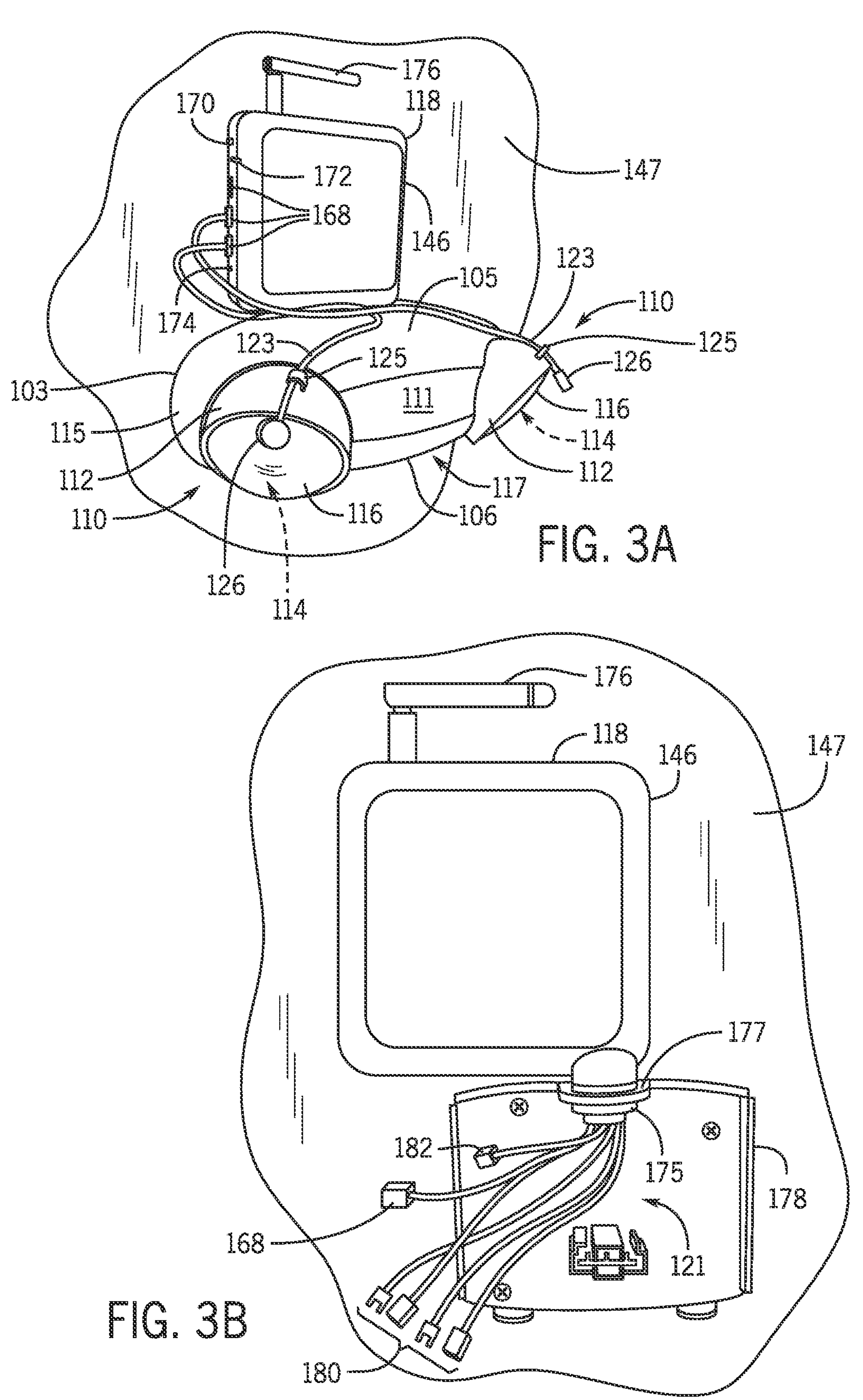
FIG. 3A illustrates a front isometric view of the node of FIG. 2A installed with an emergency lighting device.
FIG. 3B illustrates a front elevation view of the node of FIG. 2A and a mounting portion of the emergency lighting device of FIG. 3A.

FIG. 3A shows a node 118 coupled to an emergency lighting device 103. The emergency lighting device 103 is similar to the emergency lighting device 102 but does not include signage 108. The node 118 may also be retrofitted to the emergency lighting device 103. See for example, FIG. 3B showing a mounting plate 178 of the emergency lighting device 103. The mounting plate 178 is suitable to couple the emergency lighting device 103 to a building surface such as a wall or ceiling 147. The node 118 may couple to a conduit interface of the mounting plate 178. For example, the node 118 may threadedly coupled (e.g., by the connector 175) to the electrical conduit interface 177 of the mounting plate 178. The interface 177 may enable the pass-through of a routine power source connection 180, such as one or more internal wires 121 for line, neutral, ground, and a switching line for the emergency lighting device 103. The interface 177 may enable the pass-through of an internal electrical connector 168 and/or one or more internal wires 121 such as to electrically couple a sensor 126 to the node 118. The interface 177 may enable the pass-through of a voltage sensor connection 182 and/or one or more internal wires 121 suitable to monitor the voltage of the emergency power source 130 of the emergency lighting device 103. Thus, the node 118 may be retrofitted to an existing emergency lighting device 102.

As discussed herein, the node housing 146 may have a low profile size/shape, which as shown for example in FIG. 3A may enable the node 118 to be mounted on a wall or ceiling 147 near an emergency lighting device 102. The thin profile of the node housing 146 may enable the node 118 to be mounted in an inconspicuous location relative to the emergency lighting device 103. For example, the node 118 may be mounted along a wall above and substantially behind the emergency lighting device 103. Such mounting may be beneficial for a retrofit application. For example, the node 118 may be mounted to the emergency lighting device 103 without repositioning the emergency lighting device 103. As shown in FIG. 3A, the node 118 may be disposed above the emergency lighting device 103. As shown for example in FIG. 3B, the node 118 may be mounted to the top edge of the mounting plate 178. The mounting plate 178 may connect the emergency lighting device 103 to a wall or ceiling 147 and may also support the node 118.

External wire 123 may be positioned out of reach of building users. For example, one or more external wires 123 may extend from the node housing 146 above the outside of the top wall 105 of the main housing 106. The external wires 123 may extend downward from the node 118 to one or more light assemblies 110. The external wires 123 may electrically connect the node 118 to respective sensors 126. The external wires 123 may position the sensors 126 outside of the main housing 106 and within the emissive range of a light source 114 of a light assembly 110 of the emergency lighting device 102. The external wire and/or sensor 126 may be held in place by a clip 125. The clip 125 may be positionable on any portion of the main housing 106. For example, the clip 125 may include an adhesive portion that adapted to couple the clip 125 to a surface (e.g., a wall of the housing 106) and a grasping portion adapted to grasp a wire. The clip 125 may be disposed inside or outside the housing 106, as desired.

FIGS. 4A-4D show a node 118 coupled to an emergency lighting device 102 on the rear of the emergency lighting device 102. In contrast to the emergency lighting device 102 shown in FIGS. 2A and 2B, the emergency lighting device 102 shown in FIGS. 4A-4D may be coupled to an electrical enclosure 164 that is coupled to the rear wall 107 of the emergency lighting device 102. As with the emergency lighting device 102 and node 118 shown in FIGS. 2A and 2B, the node 118 may be positioned so as not to obstruct the view of the emergency lighting device 102. The node 118 may couple to the emergency lighting device 102 and operate as described herein.

As described herein, the node housing 146 may have a thin or low profile size/shape. The thin shape may enable the node housing 146 to be disposed behind an emergency lighting device 102 and in front of a wall, as shown for example in FIGS. 4A and 4B. For example, the node housing 146 may be coupled to and extend above the electrical enclosure 164. The electrical enclosure 164 may be coupled to the rear wall 107 of the main housing 106 of the emergency lighting device 102. The node housing 146 may be disposed behind the main housing 106 and in front of a wall to which the main housing is mounted. The electrical enclosure 164 may support the emergency lighting device 102 and the node 118. The electrical enclosure 164 may couple the node 118 and/or the emergency lighting device 102 to the building. Positioning the node 118 between the wall and the emergency lighting device 102 may have the benefit of placing the node 118 out of reach of building users. Such positioning may also be beneficial in a retrofit application such as by enabling the coupling of the node 118 to the emergency lighting device 102 without repositioning the emergency lighting device 102.

One or more external wires 123 may extend along the rear wall 107 between the node 118 and one or more respective light assemblies 110 of the emergency lighting device 102. The external wires 123 may electrically connect one or more sensors 126 to the node 118. The external wires 123 may position the sensors 126 in the emissive range of a light source 114 of the light assembly 110. The external wires 123 may be coupled to the housing 106 by one or more clips 125. The sensors 126 may be positioned relative to, or coupled to, a respective light assembly 110 by one or more clips.

Figures 4A, 4B, 4C:
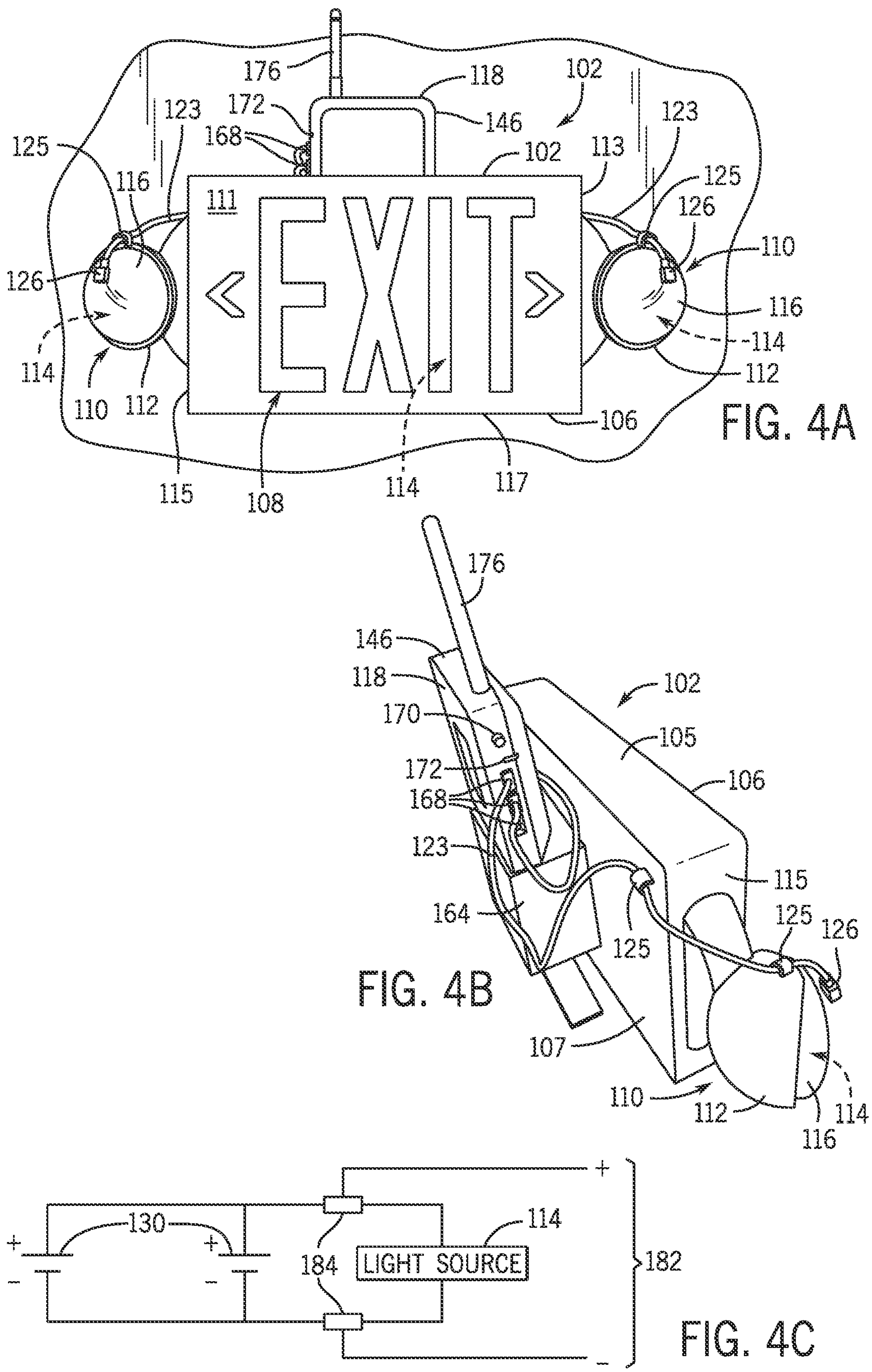
FIG. 4A illustrates a front elevation view of the node of FIG. 2A installed with an emergency lighting device.
FIG. 4B illustrates a rear isometric view of the node of FIG. 2A installed with the emergency lighting device of FIG. 4A.
FIG. 4C is a schematic view of a voltage sensing circuit of the node FIG. 2A installed with a power source of an emergency lighting device.
Figure 4D:
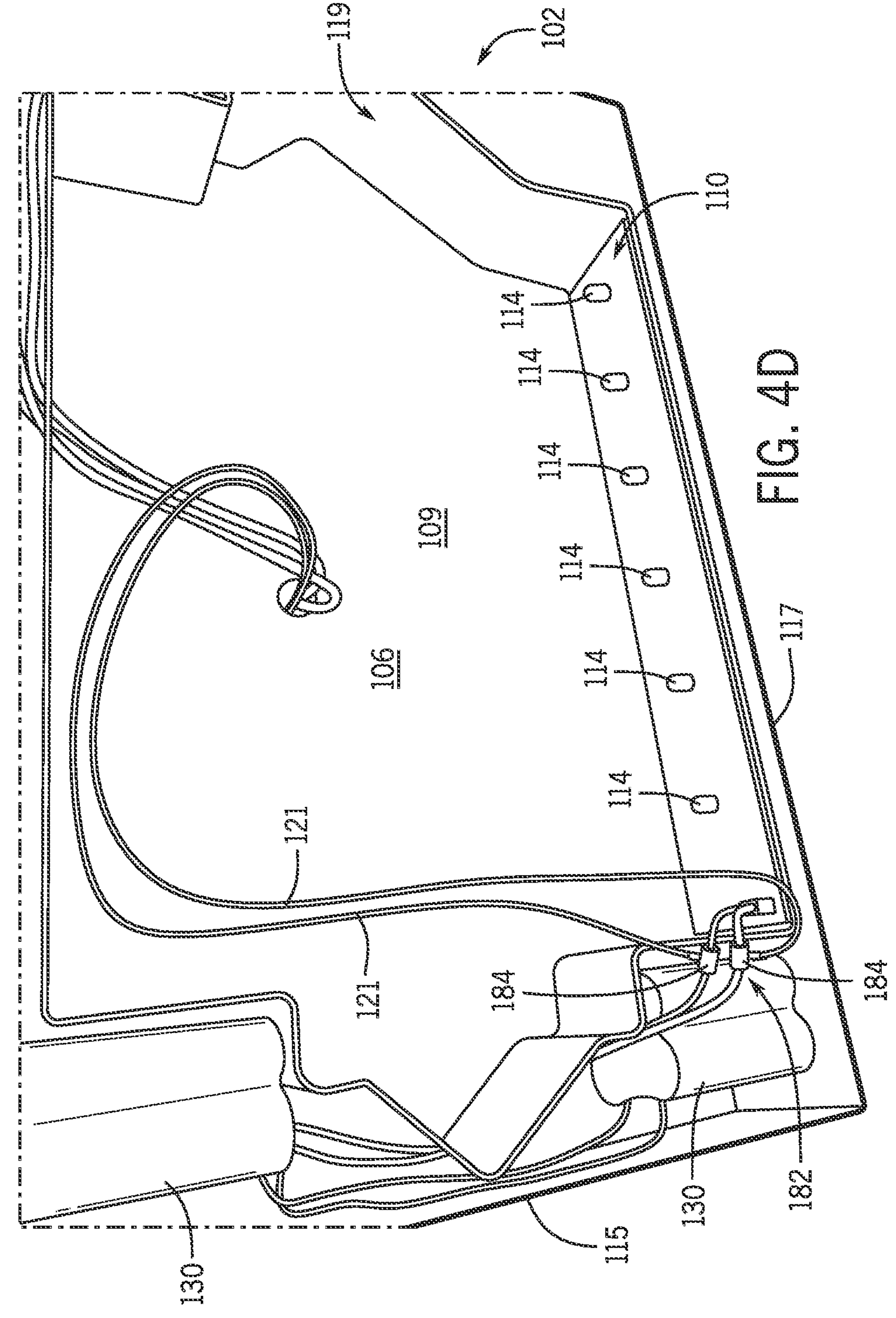
FIG. 4D is a front isometric view of the emergency lighting device of FIG. 4A with a portion of the emergency lighting device removed.
Figure 6:
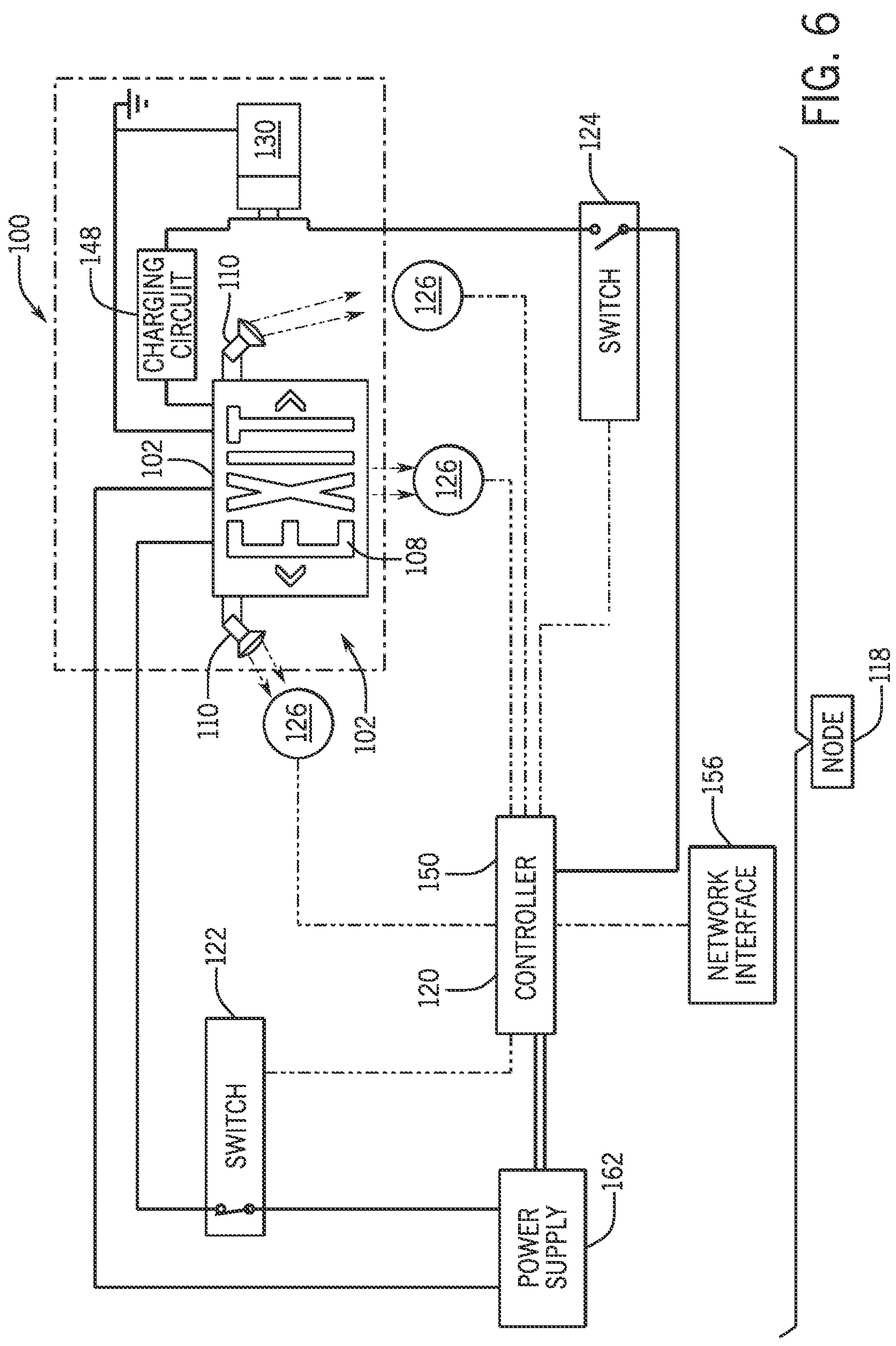
FIG. 6 illustrates a schematic view of the node of FIG. 2A.

FIGS. 4C and 4D show an example of a voltage sensor connection 182 suitable to monitor a voltage of the emergency power source 130 as described in further detail with respect to FIG. 6. FIG. 4C is a schematic view of the voltage sensor connection 182 and FIG. 4D is an isometric view of the voltage sensor connection 182 installed in the emergency lighting device 102. A sensor 126 is not shown in FIG. 4D, for the sake of clarity, but may be included as well. As shown in FIG. 4C, the emergency lighting device 102 may include one or more emergency power sources 130. Where more than one emergency power source 130 is used, the emergency power sources may be coupled to one another in parallel (as shown in FIG. 4C) or in series (not shown). The emergency power sources 130 are electrically coupled to, and configured to provide power to, a light source 114 and/or a light assembly 110 including one or more light sources. For example, a conductor such as one or more internal wires 121 may electrically couple the one or more emergency power sources 130 to the light source 114. The one or more internal wires 121 may extend between the node housing 146 and the main housing 106 in the internal compartment 119 of the main housing 106. For example, the internal wires may penetrate a wall of the main housing, such as the rear wall 107, the top wall 105, the left wall 115, the right wall 113, or the front wall 111. The voltage sensor connection 182 may include one or more electrical taps 184. The taps 184 may be configured to penetrate the insulation of the conductor to make electrical contact with the conductor and provide an electrical connection to the node 118, without removing or unplugging the conductors from the emergency power source 130 or the light source 114. Thus the node 118 may be easily retrofitted to an existing emergency lighting device 102 with minimal disruption.

Figure 5:
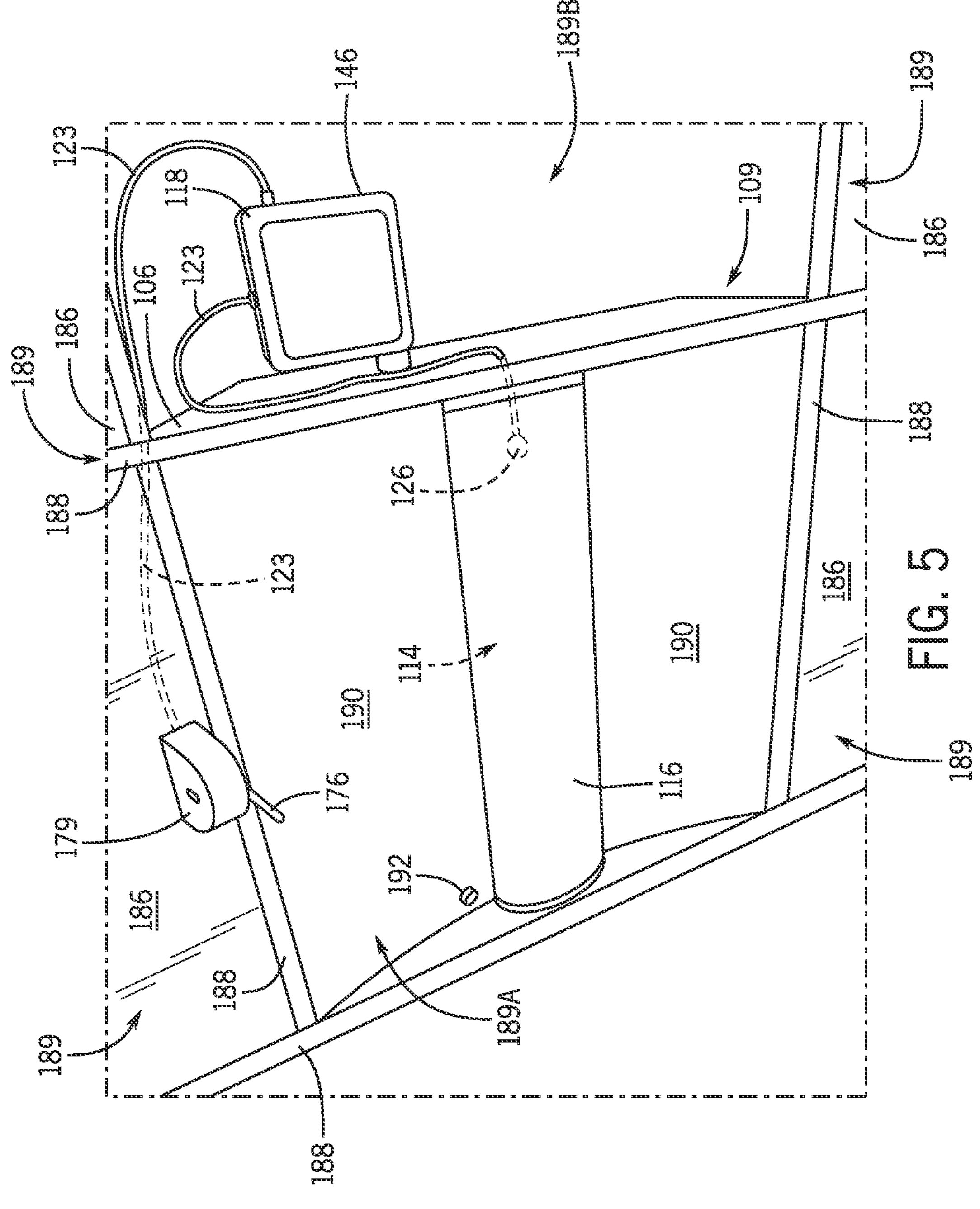
FIG. 5 illustrates a lower isometric view of a node of the emergency light testing system of FIG. 1 installed with an emergency lighting device.

FIG. 5 illustrates an emergency lighting device 109 suitable for use with the emergency light testing system 100. Like the other emergency lighting devices described herein, the emergency lighting device 101 includes a light source 114 and an emergency power source 130 (not shown) configured to power the light source 114 when the routine power source 162 is unavailable. The emergency lighting device 109 may be adapted to be installed in a ceiling such as a drop ceiling. The ceiling may be formed of ribs 188 that intersect one another to form sections. A ceiling section 189 may contain and support a ceiling panel 186 (e.g., acoustic panels or the like). A ceiling section 189 may contain and support the emergency lighting device 109. The emergency lighting device 109 may include a diffuser or lens 116 over the light source 114. A sensor 126 may be disposed in the emissive range of the light source 114. The sensor may be disposed between the light source 114 and the lens 116. The emergency lighting device 109 may include a reflector 190 to focus or direct light from the light source 114. The emergency lighting device 102 may include a status indicator 192 such as a light source. The status indicator may indicate that the emergency power source 130 of the emergency lighting device 109 is charging from a routine power source. The emergency lighting device 109 may be suitable for placement in a ceiling, such as a drop ceiling. For example, the emergency lighting device 109 may be a troffer. The emergency lighting device 109 may be configured to integrate into a drop ceiling including one or more panels 186 supported by one or more ribs 188. In some embodiments, the emergency lighting device 109 may have a portion that is the same size and shape as a panel 186. In some embodiments, the emergency lighting device 109 may be switchable on and off by a manual control such as by a wall switch, motion sensor, or the like, yet be configured to illuminate the light source on the loss of the routine power source 162 regardless of the manual control. In some embodiments, the emergency lighting device 109 may be an always-on type of light.

The node 118 may be coupleable to the emergency lighting device 109 at a portion of the emergency lighting device 109 above a suspended ceiling panel 186. Such an arrangement may enable the retrofitting of the node 118 to the emergency lighting device 109 in such a way that the node 118 may be obscured from view by a panel 186. The obscuring panel 186 is removed in FIG. 5, for clarity. An advantage of such an arrangement may be that the retrofit is a clean, aesthetically-pleasing installation where the node 118 is not generally visible to a user of the building. The node 118 shown in FIG. 5 includes a remotely-mounted antenna 176. The remotely mounted antenna 176 may be coupled to a dock or base 179. The base 179 may be in electrical communication with the node 118 by a wire such as an external wire 123. The base 179 may be configured to be placed separately from the node 118. It may be advantageous to place the antenna 176 and base 179 separately from the node 118 such that the antenna 176 can communicate with a network such as the network 128 and/or network 140, while the node 118 may be coupled with an emergency lighting device in a convenient location. For example, the base 179 may be placed in a location (e.g., below a ceiling panel 186) while the node 118 may be placed in a separate location (e.g., above the ceiling panel 186). A gateway 136 may also use a remotely mounted antenna 176 and base 179. The base 179 may be coupleable to a variety of surfaces such as walls, ceiling panels, metal, floors, pipes, or the like. For example, the node housing may be coupled to a first portion of the emergency lighting device and the antenna may be coupled to a second portion of the emergency lighting device. For example, the emergency lighting device 109 may be substantially received in a first ceiling section 189*a* and the node 118 and/or antenna 176 may be received in a second ceiling section 189*b*. The ceiling sections 189*a* and 189*b* may be adjacent to one another as shown for example, in FIG. 5. In some implementations, the ceiling sections 189*a* and 189*b* may be spaced apart from one another. For example, a third or subsequent ceiling section may be disposed between the first ceiling section and the second ceiling section. One or more wires (e.g. internal wires 121 or external wires 123) may electrically couple the node 118 to the emergency lighting device 109 and/or one or more sensors. The wires may extend between the first ceiling section 189*a* and 189*b*. The remote antenna 176 is electrically coupled to the node 118 by a cable, wire, or the like. An advantage of a remotely-mounted antenna is the ability to place the antenna 176 in a location with improved radio reception, while independently placing the node 118 elsewhere. A remotely-mounted antenna 176 may be used with any device disclosed herein, including a node 118, gateway 136, server 134, and/or user device 142.

With reference to FIG. 6, the node 118 may include a controller 120, a second test switch 124, a first test switch 122, and a network interface 156. The controller 120 may include one or more processing elements 150 as discussed herein with respect to FIG. 12. The node 118 may be coupled to a routine power source 162, such as AC power. The routine power source 162 may be shared between the node 118 and the emergency lighting device 102. The routine power source 162 supplies electrical power to the components of the node 118. The routine power source 162 may be a common power supply with the emergency lighting device 102 or may be a separate power supply. The controller 120 is in electrical communication with the one or more sensors 126 as shown by the dashed lines in FIG. 6.

The controller 120 is in electrical communication with the first test switch 122 and the second test switch 124. For example, the controller 120 may operate the first test switch 122 and/or the second test switch 124. As used herein, a switch is any device that can establish or sever the flow of electrical power. For example, a switch may be a relay (e.g., an electrical contact operated by an actuator such as an electromagnet, or the like), a semiconductor such as a transistor, field effect transistor, or other suitable device.

In many embodiments, the first test switch 122 is a normally closed switch. The first test switch 122 is operative to selectively establish or interrupt electrical power to the emergency lighting device 102. For example, absent a command from the controller 120, the first test switch 122 may allow electrical power to flow from the routine power source 162 to the emergency lighting device 102 enabling the emergency lighting device 102 to operate normally. An advantage of using a normally closed first test switch 122 is that in the event of a failure or loss of power to the node 118, the operation of the emergency lighting device 102 is unaffected. The first test switch 122 may receive a command from the controller 120 causing the first test switch 122 to interrupt electrical power to the emergency lighting device 102. Such loss of a routine power source 162 may cause the emergency lighting device 102 to enter its emergency operation mode, such as illuminating one or more light sources 114 via the emergency power source 130. As discussed in more detail with respect to the method 600, the one or more sensors 126 may detect light emitted by the light sources 114 of the emergency lighting device 102. The sensors 126 may send a signal to the controller 120 indicative of the light detected.

In many embodiments, the second test switch 124 is a normally open switch. The second test switch 124 is operative to selectively establish or interrupt a connection between the emergency power source 130 of the emergency lighting device 102 and the controller 120. For example, absent a command from the controller 120, the second test switch 124 may prevent electrical power from flowing from the emergency power source 130 of the emergency lighting device 102 to the controller 120. The controller 120 may have an input such as an analog or digital input adapted to detect a voltage of the emergency power source 130. As discussed in more detail with respect to the method 600, the controller 120 may be operative via the second test switch 124 to determine a condition of the emergency power source 130 and/or a charging circuit that charges the emergency power source 130 when the emergency lighting device 102 is not in an emergency mode.

Figure 7:
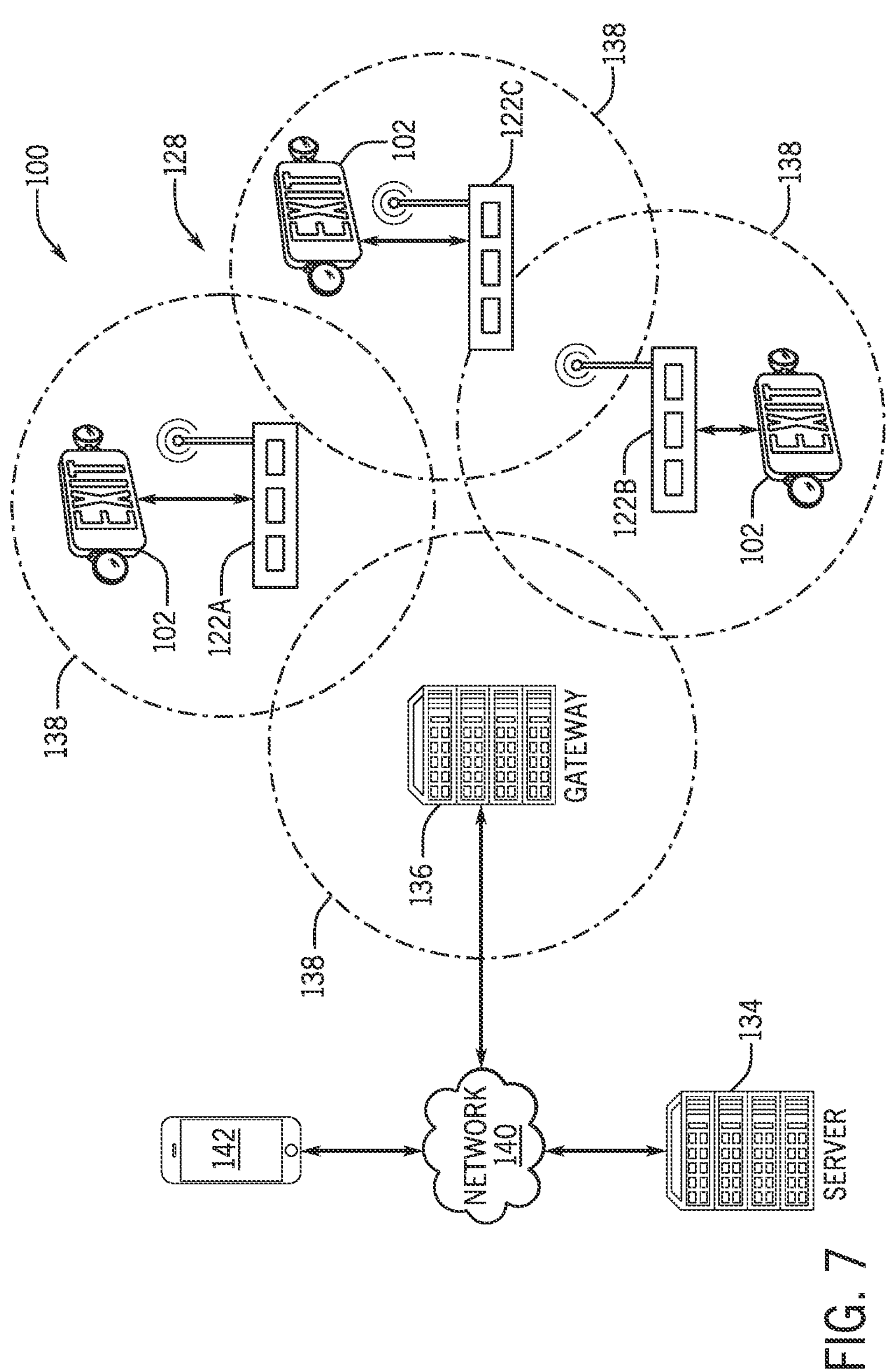
FIG. 7 illustrates a schematic view of the emergency light testing system of FIG. 1.

With reference to FIG. 7, an emergency light testing system 100 may include one or more nodes 118 that may be in communication with a gateway 136 and/or with other nodes 118. The emergency light testing system 100 may optionally include a server 134 and/or a user device 142. The gateway 136, server 134, node 118, and/or user device 142 may be in communication with one another via a network 140 by respective network interfaces 156 thereof. The network 140 may be a wired or wireless network. For example, the network 140 may be an Ethernet network, Wi-Fi, Bluetooth, Wi-Max, Zigbee network, a sub-gig network, the internet, microwave link, or the like.

In one embodiment, two or more nodes 118 of an emergency light testing system 100 may form a local network 128. The local network 128 may facilitate communication between the nodes 118 and the gateway 136. In some embodiments, the local network 128 has a star or hub and spoke topology where each node 118 is in communication with the gateway 136. In some embodiments, the local network 128 has a mesh topology. The local network may include more than one gateway 136. The local network 128 may be formed by the respective network interfaces 156 of the nodes 118 and/or the gateway 136. The gateway 136 may be operative to establish, manage, and/or maintain the local network 128. For example, the gateway 136 may manage the local network. As shown in FIG. 7, the network interface 156 of a node 118 may have a finite range 138. For example, a node 118 may be able to communicate via its network interface 156 a distance of about 5, 10, 20, 30, 40, 50 or more meters. For example, if the network interface 156 uses a Bluetooth protocol, the node 118 may have a range 138 of about 5-10 meters. In another example, if the network interface 156 uses a Wi-Fi protocol, the node 118 may have a range of about 50 meters. In some embodiments, a mesh network is a flooded mesh in that each node 118 receives all communication on the local network 128. Each node 118 may also transmit each message it receives. Thus, communications including commands and data may be passed between nodes 118 and the gateway 136 in the emergency light testing system 100 even if a particular node is not within range of the gateway 136.

In some embodiments, the local network 128 uses a "sub-gig" wireless protocol. A sub-gig protocol operates at a nominal frequency generally below 1 GHz. For example, the local network 128 may operate at a frequency in the range of about 868 MHz to about 928 MHz. For example, the network 128 may operate at a frequency of about 900 MHZ, 915 MHz, or other frequencies in the range above. Some implementations of sub-gig communications protocols are described in Institute of Electrical and Electronics Engineers ("IEEE") standard 802.15.4g, which is incorporated herein by reference in its entirety. In some embodiments, the local network 128 may operate with a "long range" or "LoRa" radio modulation technique described for example in U.S. Pat. No. 9,647,718 which is incorporated herein by reference in the entirety. A sub-gig protocol may have advantages of longer range and/or lower power consumption compared to Wi-Fi and Bluetooth protocols. For example, a network interface 156 using a sub-gig protocol may have a range 138 of about a mile. Additionally, a sub-gig network may avoid interference with existing Wi-Fi and/or Bluetooth networks due to the use of a different frequency band (Wi-Fi generally operates at frequencies above those of sub-gig e.g., 2.4 GHz and 5 GHZ. Bluetooth generally operates at about 2.45 GHZ). Thus, a sub-gig network may be more reliable than a Bluetooth or Wi-Fi network. However, a sub-gig network may have a lower data transmission capability (i.e., bandwidth) than a Bluetooth or Wi-Fi network. In implementations where a high data transmission capability is desired (e.g., a building with thousands of nodes), a Bluetooth or Wi-Fi protocol may be desired.

The range 138 of the network interface 156 of the gateway 136 and its placement in the building 104 may be such that the gateway 136 is in communication via its network interface 156 with the nodes **118*a* and 118*b* via their respective network interfaces 156. In other words, the range 138 of the node 118*a* overlaps with that of the gateway 136. Likewise, the range 138 of the node 118*b* overlaps with that of the gateway 136. A third node 118*c* may have a range 138 that overlaps with the ranges of both the nodes 118*a* and 118*b*, but that does not overlap with the range 138 of the gateway 136. In the local network 128, communications may be flooded i.e., received and relayed by each device (gateway 136 and/or node 118) in the local network 128. Thus, even though the node 118*c* cannot communicate directly with the gateway 136 due to their non-overlapping ranges, the node 118*c* and gateway 136 may still be in communication via the nodes 118*a* and 118*b*. A local network 128 may include as many nodes as desired to cover a given building 104. In some implementations, a node 118 may not be associated with an emergency lighting device 102 and may be used a bridge to provide connectivity to the local network 128. An advantage of a mesh network may be that the effective range of the local network 128 may be extended without the need for large or powerful network interfaces 156. Further, a mesh network may be deployed to cover a large building 104 or multiple buildings 104 without the need to run expensive wiring throughout the building 104**.

Either a star topology or a mesh topology for the local network 128 may be used with any network protocol. A mesh network topology for the local network 128 may be preferable in some embodiments and a star topology may be preferable in other embodiments. For example, in some implementations, where the local network 128 uses Bluetooth, a mesh topology may be more suitable for the lower range of Bluetooth as compared to a sub-gig protocol. Likewise, when a sub-gig protocol is used, the longer range of the protocol may enable the use of a star network topology.

Figure 8:
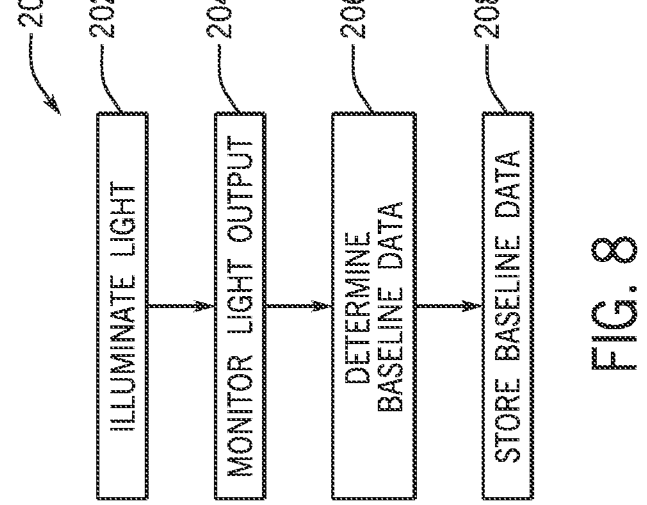
FIG. 8 illustrates a method of calibrating the node of FIG. 2A.

With reference to FIG. 8, a method 200 of calibrating a node 118 is disclosed. The method may begin in operation 202 and the node 118 causes the emergency lighting device 102 to illuminate a light source 114. For example, the node 118 may send a command to open the first test switch 122 thereby interrupting the flow of electricity to the emergency lighting device 102. The emergency lighting device 102 may detect the interruption of power as an emergency condition and illuminate one or more light sources 114. In examples where the light source 114 is always-on, such as a radioluminescent light source, operation 202 may be optional.

The method 200 may proceed to operation 204 and the node 118 monitors light output from one or more light sources 114, such as via sensors 126 disposed near the light sources 114. As discussed herein, the sensor 126 may convert incident light to a corresponding electrical signal that is read by the controller 120.

The method 200 may proceed to operation 206 and the controller 120 determines baseline data for the light source 114. For example, the sensor 126 may detect the radiant flux of the light source 114 illuminated in operation 202. The controller 120 may receive a signal from the sensor 126 indicating the radiant flux.

The method 200 may proceed to operation 208 and the controller 120 may record date related to the radiant flux in a memory component 154 as the baseline data for the one or more light sources 114 associated with an emergency lighting device 102. Additionally, or alternately, the controller 120 may transmit the baseline data to another part of the emergency light testing system 100 for storage, such as the gateway 136, the server 134, and/or the user device 142. The node 118 may transmit the baseline data via the local network 128.

One advantage of calibrating the light output of a light source with a sensor 126 and the method 200 is that a sensor 126 can detect changes in the intensity of the light sources 114 over time that may not be apparent to human inspectors. For example, the main failure mode of incandescent lamps may be breakage of the filament, such that the light stops working entirely, which is a relatively clear contrast between light and no light. However, more modern light sources may become dim over time such that the light output is degraded below a desired threshold. For example, in halogen lamps, a portion of the filament may vaporize when the lamp is illuminated and may deposit on the glass of the lamp, thereby obscuring light from the lamp. In another example, an LED may become dim over time due to degradation of the semiconductor junction and/or phosphor therein. In another example, a radioluminescent light source may become dim over time due to natural radioactive decay of the radioisotope. In any these examples, the method 200 may be suitable to calibrate the output of the light source to later detect changes in the light output of the light source 114 and generate an alert or report notifying a user to take appropriate action to correct the deficient light source 114.

Figure 9:
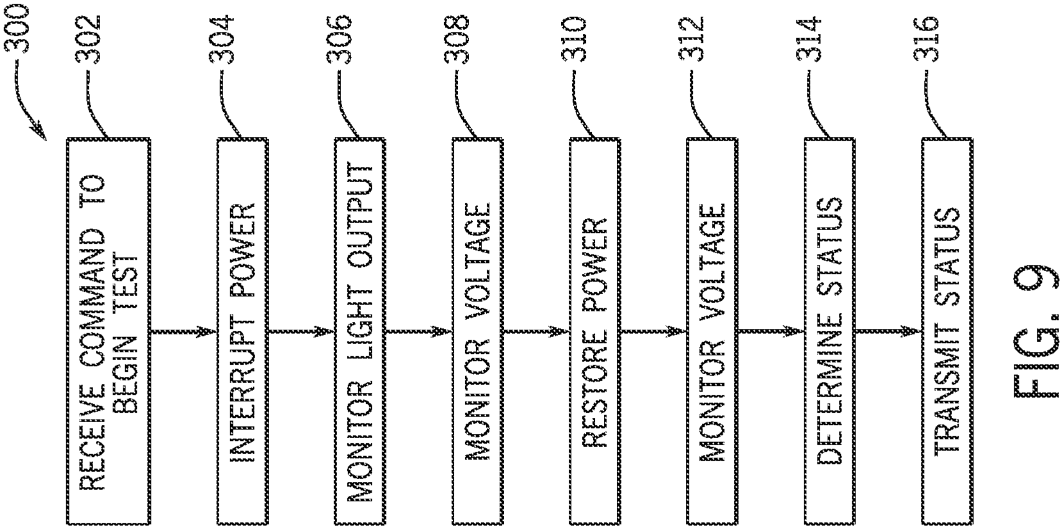
FIG. 9 illustrates a method of testing an emergency light for use with the emergency light testing system of FIG. 1.

With reference to FIG. 9, a method 300 of testing an emergency lighting device 102 via the emergency light testing system 100 is disclosed. The method 300 may begin in operation 302 and the emergency light testing system 100 receives a command to begin a test of one or more emergency lighting devices 102. In some embodiments, the command may be received by a user interface 400 from a user 132. In some embodiments, the command may be received by the user device 142. In some embodiments, the command may be received locally by a node 118. For example, the node 118 may receive a local test command via the tactile input 170 or the service input 174 operative to begin execution of the method 300 and/or the method 200. In some implementations, such as where the emergency power source is a centralized source such as a battery bank or generator, the emergency light test system 100 may include a sensor that detects the activation of the centralized emergency power source. For example, the system 100 may include a current sensor that detects electrical current flowing out of the centralized emergency power source. In such implementations, the detection of current flowing out of the centralized emergency power source may cause the system 100 to omit the operation 304 and trigger the operation 306, both discussed below.

In some embodiments, the operation 302 may be triggered according to a schedule. For example, the gateway 136, one or more nodes 118 may be configured to execute a test command on a schedule based on a regulatory requirement. For example, a monthly 30 second test and/or a 90 second annual test may be executed based on an automatic schedule. The command to perform a test may be transmitted from the gateway 136 to one or more nodes 118 on the local network 128 such as a mesh network 140.

In some implementations, a node 118 may enter a low power or sleep state until a change in a status condition is detected. When a change in a status condition is detected, the node 118 may enter a more active or high power state, where the node 118 executes the steps of the method 300. When the method concludes, the node 118 may return to the lower power state. Thus a node 119 may reduce an amount of electrical power consumed relative to remaining in an active or high power state.

The method 300 may proceed to operation 304 and a node 118 interrupts power to the emergency lighting device 102. Operation 304 may be substantially similar to the operation 202. As with operation 202, the operation 304 may be optional with always-on light sources 114. The method 300 may proceed to operation 306 and the node 118 monitors the light output of one or more light sources 114 of the emergency lighting device 102. The operation 306 may be substantially similar to the operation 204, further description of which is omitted for brevity.

The method 300 may proceed to operation 308 and the node 118 monitors the voltage of the emergency power source 130 of the emergency lighting device 102. For example, the controller 120 may cause the second test switch 124 to close, electrically connecting the emergency power source 130 to an input of the controller 120. The operation 306 and operation 308 may be executed in an order other than as shown. For example, the operation 306 and the operation 308 may be executed in parallel with one another. In another example, the controller 120 may monitor the voltage of the emergency power source 130 before the node 118 executes operation 306. The controller 120 may continue to monitor the voltage of the emergency power source 130 during the test of the light source 114 in operation 306. In some embodiments, of the method 300 one of the operation 306 or operation 308 may be optional. For example, the emergency light testing system 100 may monitor the voltage of the emergency power source 130 without interrupting power to the emergency lighting device 102.

The method 300 may proceed to the operation 310 and the node 118 restores power to the emergency lighting device 102. For example, the controller 120 may remove the signal to the first test switch 122 causing the first test switch 122 to close, thus restoring power to the emergency lighting device 102 from the routine power source 162. Upon restoration of power from the routine power source 162, the emergency lighting device 102 may exit the emergency operation mode and turn off one or more light sources 114. A predetermined amount of time (T) may elapse between the operation 304 and the operation 310. For example, T may be 30 seconds, such that the method 300 performs a monthly test of the emergency lighting device 102. In another example, T may be 90 minutes, such that the method 300 performs an annual test of the emergency lighting device 102. Other values of T may be selected as desired, without limitation.

The method 300 may proceed to operation 312 and the controller 120 monitors the voltage of the emergency power source 130 after the restoration of power from the routine power source 162 in operation 310. By monitoring the voltage of the emergency power source 130 before and after the operation 306 is executed, the node 118 may be able to assess the operation of the emergency power source 130 and/or charging circuit 148. For example, when the emergency power source 130 is a battery, the voltage of the battery may fall during the test (e.g., between operation 304 and operation 310) due to the battery discharging, Ohm's law losses, etc. When the routine power source 162 is re-established in operation 310 the voltage of the emergency power source 130 will often increase compared to when the routine power source 162 is disconnected due to the removal of the lighting load on the emergency power source 130 and/or due to charging of the emergency power source 130 by the charging circuit 148. With some types of emergency lighting devices 102, operation 312 may be optional. For example, with radioluminescent emergency lighting devices 102 that do not have a power supply, the operation 312 may be skipped. Similarly, operation 312 may be optional with switched emergency lights.

The method 300 may proceed to operation 314 and the emergency light testing system 100 determines the status of the emergency lighting device 102. The status may be determined relative to a regulatory requirement. The status may include compliance data indicating the compliance of the emergency lighting device 102 with the regulatory requirement. The operation 314 may be executed by any device of the emergency light testing system 100. In some examples, the status of the emergency lighting device 102 is determined by the controller 120. In some examples, the controller 120 collects data on the emergency lighting device 102 as described in the method 300 and transmits that data to another device (e.g., the gateway 136, the server 134, another node 118, and/or the user device 142) of the emergency light testing system 100 and the other device determines the status of the emergency lighting device 102. For example, the controller 120 may compare the light output monitored in operation 306 against a standard or regulatory requirement and determine whether the light output and/or time of light output of a light source 114 meets the standard or requirement. In another example, the controller 120 may compare the light output measured in operation 306 against baseline data as determined in the method 200 and stored in operation 208. The controller 120 may determine whether the light output has diminished more than a threshold amount compared to the baseline data.

In other examples of the operation 314, the emergency light testing system 100 may determine whether the emergency power source 130 and/or charging circuit 148 are functioning properly. For example, the controller 120 may compare the voltage of the emergency power source 130 to a baseline or standard. When the voltage falls below the baseline or standard, the emergency power source 130 may be determined to be faulty. In another example, the controller 120 may monitor the voltage over the course of the test (e.g., between operation 304 and operation 310) and determine a rate of change of the voltage. The rate of change may similarly be compared to a baseline or standard to determine whether the emergency power source 130 and/or charging circuit 148 are operating normally. In another example, a failure of the voltage to increase in operation 312 after the restoration of the routine power source 162 may indicate that the charging circuit 148 and/or emergency power source 130 are damaged or non-operative.

The method 300 may proceed to the operation 316 and the device of the emergency light testing system 100 that determined the status of the emergency lighting device 102 transmits the status. In one example, the status is determined by the controller 120 of the node 118 associated with a particular emergency lighting device 102. The controller 120 may transmit the status via the network interface 156 of the node 118 over the local network 128 to the gateway 136. For example, the node 118 may send a flood message on the mesh network indicating the status of the emergency lighting device 102 with which the node 118 is associated. That message may be received and stored by the gateway 136 and/or server 134 in a memory component 154. In some examples the status is transmitted by issuing an alert such as a visible and/or audible warning or alarm. For example, the emergency light testing system 100 may generate a sound if an emergency lighting device 102 fails a test.

Figure 10:
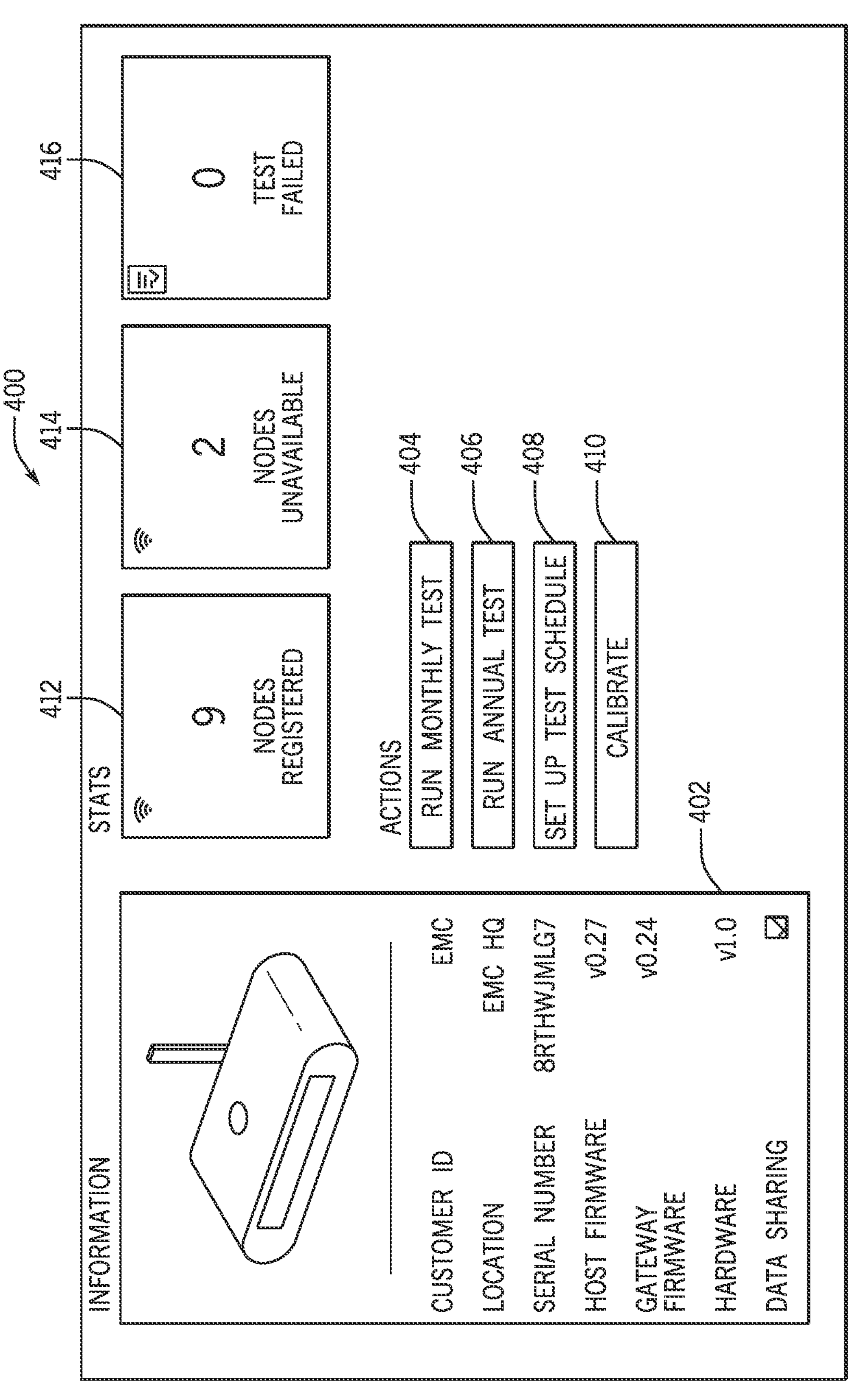
FIG. 10 illustrates an example of a user interface of a gateway of the emergency light testing system of FIG. 1.

With reference to FIG. 10 a user interface 400 is disclosed. The user interface 400 may be displayed by any device of the emergency light testing system 100 such as a node 118, a gateway 136, a server 134, and/or a user device 142. The user interface 400 may include a number of areas to either display status of the devices of the emergency light testing system 100 and/or enable the initiation of tests of one or more emergency lighting devices 102.

The user interface 400 may include a gateway information area 402 that provides status information about the gateway 136 such as a customer identifier; location; serial number; firmware version, hardware version, and/or an input to enable data sharing. Data sharing may enable the gateway 136 to send information to the network 140.

The user interface 400 may include one or more testing actuators operative to initiate the method 300, such as a first testing actuator 404 and/or a second testing actuator 406. In one example, the first testing actuator 404 is operative to initiate a monthly (e.g., 30 second) test of one or more emergency lighting devices 102. In one example, the second testing actuator 406 is operative to initiate an annual (e.g., 90 minute) test of one or more emergency lighting devices 102. A test actuator may be operative to initiate a test on a single emergency lighting device 102, a group of emergency lighting devices 102 (e.g., all the emergency lighting device 102 on a floor or all emergency lighting devices 102 at exterior doors), all the emergency lighting devices 102 in a building 104, and/or all the emergency lighting devices 102 across two or more buildings 104. Tests of multiple nodes 118 may be executed at the same time, or they may be staggered individually or in groups. An advantage of staggering testing may be the reduction of traffic along the local network 128 to help enable the robust receipt and delivery of communications along the local network 128. For example, initiating many simultaneous tests of emergency lighting devices 102 may cause communications traffic among the nodes 118 and the gateway 136 to exceed the bandwidth of the local network 128. Staggering testing can thus help preserve bandwidth.

The user interface 400 may include a scheduling actuator 408. The scheduling actuator 408 may be operative to enable the setup of a schedule for performing one or more tests (e.g., executions of the method 300) such that the tests occur automatically (e.g., every month or every year). Scheduling of tests has many benefits. For example, if the tests are automatically scheduled, the likelihood of human error such as forgetting to perform the tests may be reduced. Additionally, testing may be scheduled for a time when the building 104 is lightly occupied (e.g., outside of normal business hours, at night, weekends, holidays, and/or early morning) so as to avoid disruptions to activities within the building 104 caused by the test, and further without a user needing to be present in off-hours to perform the test.

The user interface 400 may include a calibration actuator 410 operative to execute the method 200 for one or more emergency lighting devices 102. Calibrations may be scheduled similarly to tests using the scheduling actuator 408 as described.

The user interface 400 may include a registration status area 412 that indicates the number of nodes 118 registered with the emergency light testing system 100. The user interface 400 may include an availability status area 414 that indicates the availability (or non-availability) of any of the registered nodes 118. The user interface 400 may include a test result status area 416 that indicates the number of tests of emergency lighting devices 102 that have passed and/or failed.

With reference to FIG. 11, the user interface 400 may include a node listing 418. The node listing 418 may include entries of data related to one or more nodes 118. For example the node listing 418 may include a simplified status region 420 and/or a detailed status region 422. A simplified status region 420 may provide high-level data about a node 118 such as the node's name, latest test result, latest test date and/or time, test duration, etc. A detailed status region 422 may include the data displayed in the simplified status region 420 plus additional data, such as detailed test results of an emergency lighting device 102 including light source 114-specific results (e.g., "lamp 3 failed"), emergency power source 130 part number, starting and ending emergency power source 130 voltages, status of the emergency power source 130 and/or charging circuit 148, etc. A simplified status region 420 may be convertible to a detailed status region 422 and vice versa.

Figure 12:
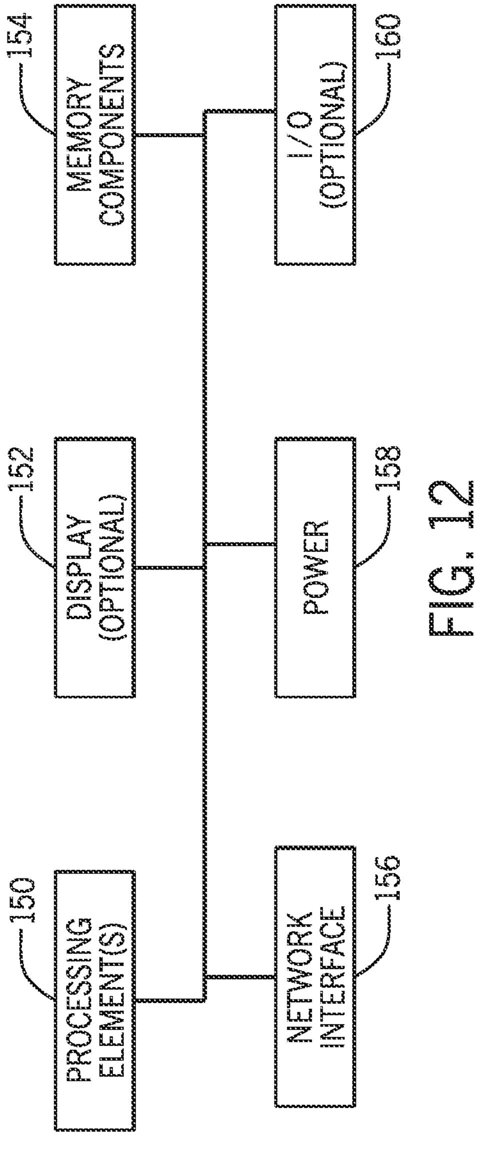
FIG. 12 is a block diagram of components of devices of the emergency light testing system of FIG. 1.

FIG. 12 illustrates a simplified block diagram for the various devices of the emergency light testing system 100 including a node 118, a gateway 136, a server 134, and/or a user device 142. As shown, the various devices may include one or more processing elements 150, an optional display 152, one or more memory components 154, a network interface 156, power source 158, and an optional input/output interface 160, where the various components may be in direct or indirect communication with one another, such as via one or more system buses, contract traces, wiring, or via wireless mechanisms.

The one or more processing elements 150 may be substantially any electronic device capable of processing, receiving, and/or transmitting instructions. For example, the processing elements 150 may be a microprocessor, microcomputer, graphics processing unit, or the like. It also should be noted that the processing elements 150 may include one or more processing elements or modules that may or may not be in communication with one another. For example, a first processing element may control a first set of components of the computing device and a second processing element may control a second set of components of the computing device where the first and second processing elements may or may not be in communication with each other. Relatedly, the processing elements may be configured to execute one or more instructions in parallel locally, and/or across the network 140 and/or the local network 128, such as through cloud computing resources.

The display 152 is optional and provides an input/output mechanism for devices of the emergency light testing system 100, such as to display visual information (e.g., images, the user interface 400 or other user interfaces, videos, notifications, and the like) to a user 132, and in certain instances may also act to receive user input (e.g., via a touch screen or the like). The display 152 may be an LCD screen, plasma screen, LED screen, an organic LED screen, or the like. The type and number of displays 152 may vary with the type of devices (e.g., smartphone versus a desktop computer).

The memory components 154 store electronic data that may be utilized by the devices of the emergency light testing system 100, such as audio files, video files, document files, programming instructions, test data and logs, baseline data, and the like. The memory components 154 may be, for example, non-volatile or non-transitory storage, a magnetic storage medium, optical storage medium, magneto-optical storage medium, read only memory, random access memory, erasable programmable memory, flash memory, or a combination of one or more types of memory components. In many embodiments, the server 134 and/or gateway 136 may have a larger memory capacity than a node 118 or user device 142, with the memory components optionally linked via a cloud network or the like.

The network interface 156 receives and transmits data to and from the local network 128 and/or network 140 between the various devices of the emergency light testing system 100. The network interface 156 may transmit and send data to the local network 128 and/or network interface 156 directly or indirectly. For example, the network interface 156 may transmit data to and from other computing devices through the local network 128 and/or the network 140. In some embodiments, the network interface 156 may also include various modules, such as an application program interface (API) that interfaces and translates requests across the local network 128 and/or network 140 to the specific server 134, gateway 136, node 118, and/or user device 142. The network interface may communicate via Ethernet, Wi-Fi, Bluetooth, Wi-Max, Zigbee, a sub-gig protocol, or any other protocol suitable to form the local network 128 or the network 140, The various devices of the system may also include a power source 158. The power source 158 provides power to various components of the node 118, the gateway 136, the server 134 and/or the user device 142. The power source 158 may include one or more rechargeable, disposable, or hardwire sources, e.g., batteries, power cord, AC/DC inverter, DC/DC converter, or the like. In some examples, the power source 158 is a routine power source 162 that may be shared with one or more emergency lighting devices 102. The power source 158 may be an emergency power source 130, such as a battery. Additionally, the power source 158 may include one or more types of connectors or components that provide different types of power to the devices of the emergency light testing system 100. In some embodiments, the power source 158 may include a connector (such as a universal serial bus) that provides power to the computer or batteries within the computer and also transmits data to and from the device to other devices.

The optional input/output interface 160 allows the emergency light testing system 100 devices to receive input from a user 132 and provide output to a user 132. In some devices, for instance the node 118, the I/O interface may be optional. In some examples, the input/output interface 160 may include a capacitive touch screen, keyboard, mouse, stylus, or the like. The type of devices that interact via the input/output interface 160 may be varied as desired.

Figure 13:
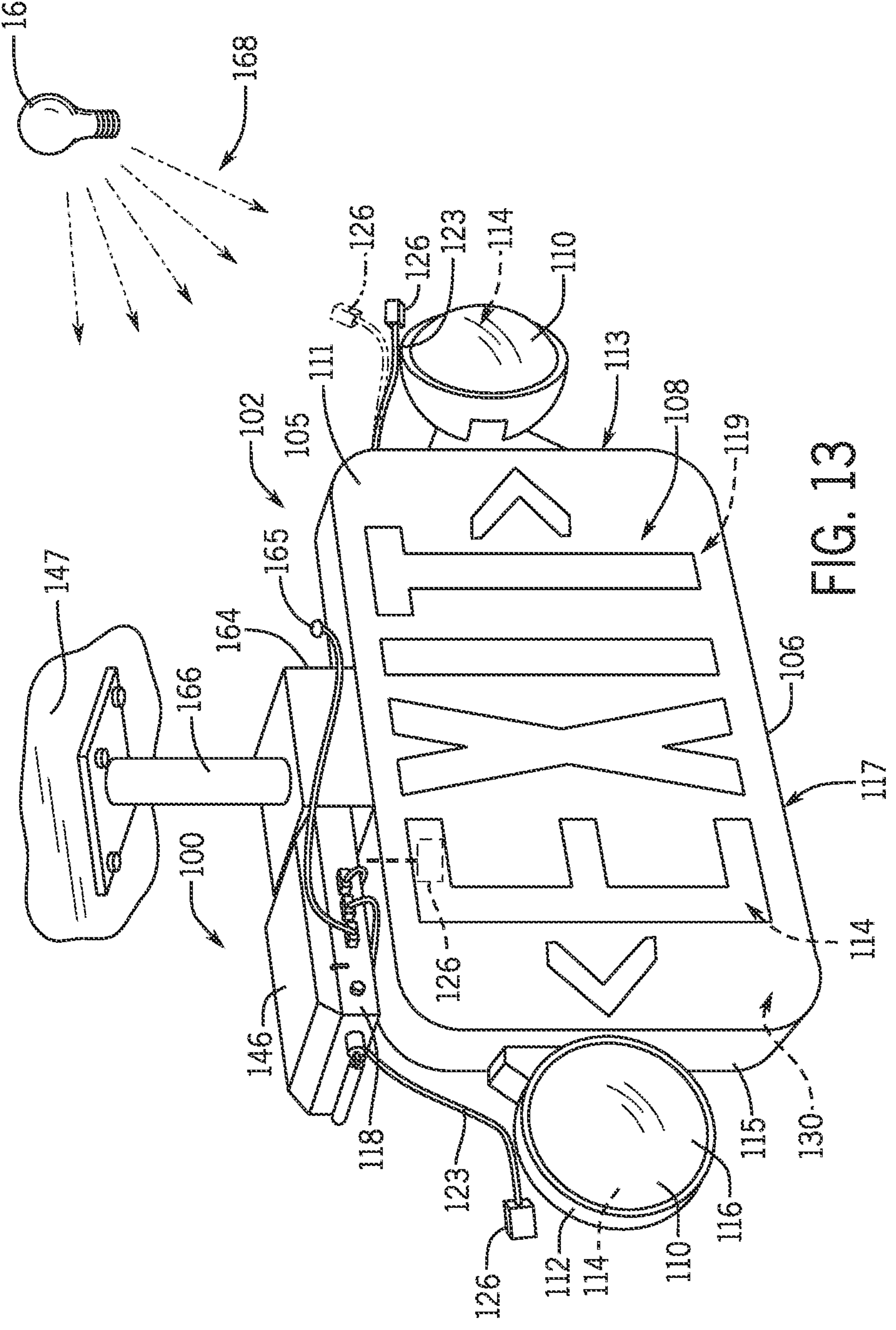
FIG. 13 illustrates a front isometric view of a node of the emergency light testing system of FIG. 1 configured with an ambient light sensor and installed with an emergency lighting device.
Figure 14:
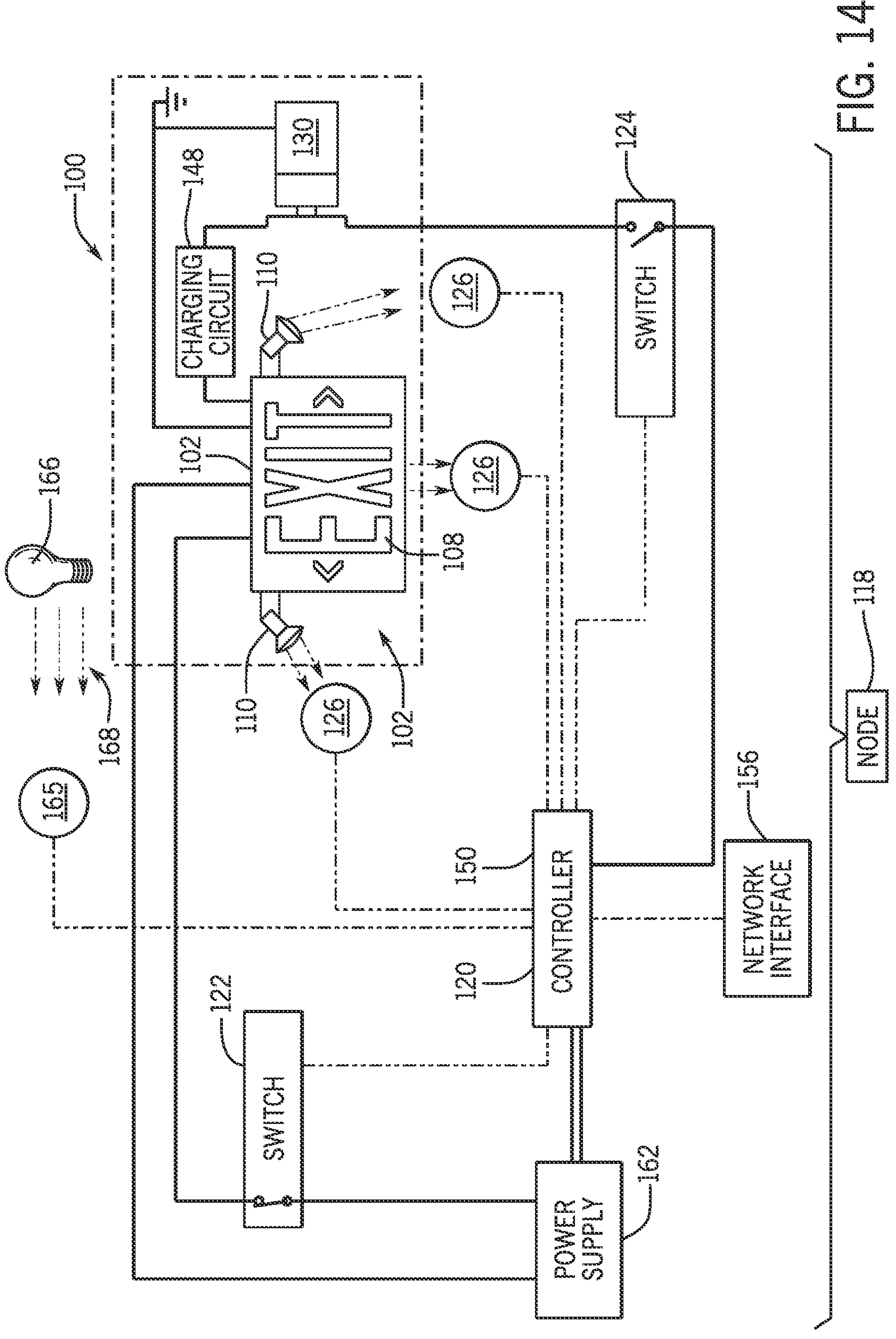
FIG. 14 illustrates a schematic view of the node of FIG. 2A configured with an ambient light sensor.

FIG. 13 and FIG. 14 show an optional configuration for an emergency lighting device 102. As shown for example, the emergency lighting device 102 may be in electrical communication with an ambient light sensor 165. The ambient light sensor 165 may be similar to, or the same as, a sensor 126. In some embodiments, the ambient light sensor 165 may include optics that average or normalize light falling thereon. Examples of such optics include, but are not limited to, lenses (e.g. Convex, concave, Fresnel, etc.) and/or frosting. The ambient light sensor 165 is positioned so as to measure ambient light 168 from an ambient light source 166 falling on at least a portion of the emergency lighting device 102, or in the vicinity thereof. The ambient light sensor 165 may be at least partially shielded from light emitted by the light assembly 110 and/or light source 114. In some embodiments, the ambient light sensor 165 may be selectively shielded from the ambient light 168. The ambient light source 166 may be any source of light that can emit, reflect, or transmit ambient light 168 that at least partially falls on the emergency lighting device 102, or in the vicinity thereof. Non-limiting examples of an ambient light sources 166 include luminaires, the sun, the moon, automobile headlights, flashlights, the light assembly 110 or light source 114 of the emergency lighting device 102 with which the ambient light sensor 165 is in communication, other emergency lighting devices 102, any combination of the above, etc. Ambient light may also fall on the emergency lighting device 102, or in the vicinity thereof from an architectural feature such as a window, skylight, archway, door, or the like. The ambient light 168 may be any kind of light, e.g., direct light, reflected light, diffuse light.

As with the sensors 126, the ambient light sensor 165 is in electrical communication with the controller 120. The ambient light sensor 165 may have an electrical output corresponding to an intensity of light falling thereon. The processing element 150 of the controller 120 may read the electrical output of the ambient light sensor 165. The ambient light sensor 165 may be used to calibrate the emergency lighting device 102 and may be used in test methods of the emergency lighting device 102, as described herein. An advantage of using an ambient light sensor 165 may be enhanced ability of the emergency lighting device 102 to comply with industry standards such as for emergency lighting devices, such as Underwriter's Laboratories standard UL 924 "Standard for Emergency Lighting and Power Equipment" or similar foreign international standards. Another advantage may be the ability to accurately discriminate between activation of a light assembly 110 or light source 114 and an ambient light 168 to discard false successful lighting tests. The ambient light sensor 165 and associated calibration method 1500 and test method 1600 are described with respect to an emergency lighting device 102. However, an ambient light sensor 165 and the associated calibration method 1500 and test method 1600 may be used with many emergency lighting devices in addition to those disclosed herein.

Figure 15:
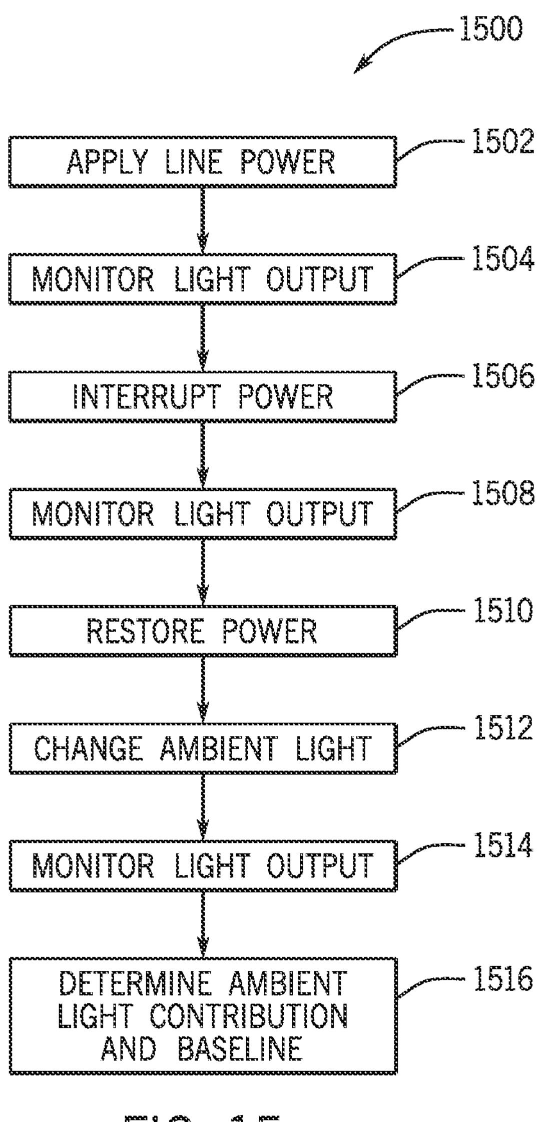
FIG. 15 illustrates a method of calibrating the node of FIGS. 13 and 14 configured with an ambient light sensor

FIG. 15 shows an example of a calibration method 1500 suitable for use with an emergency lighting device 102 that uses an ambient light sensor 165. The calibration method 1500 may begin in operation 1502 where the controller 120 applies line power to the emergency lighting device 102, such that the emergency lighting device 102 is in a non-emergency mode. For example, the first test switch 122 may close. In response, the emergency lighting device 102 may turn off the light assemblies 110. Operation 1502 may be substantially similar to operation 310 described elsewhere herein. The operations of the calibration method 1500 may be executed in an order other than as shown. One or more operations may be omitted from the calibration method 1500.

The calibration method 1500 may proceed to operation 1504 and the processing element 150 monitors light output from one or more light sources 114, such as via sensors 126 disposed near the light sources 114. The light assemblies 110 may be off in this operation. Additionally, the processing element 150 monitors the ambient light 168 via the ambient light sensor 165. As discussed herein, the sensor 126 and the ambient light sensor 165 may convert incident light to a corresponding electrical signal that is read by the processing element 150 of the controller 120. The ambient light 168 may include light emitted by the light source 114, either directly, via scattering, or reflection. The light intensity (e.g., foot candles, lux, etc.) of the light measured by the sensor 126 and the ambient light sensor 165 may be stored, such as in the memory component 154. In the example calculations below, the following nomenclature is used for clarity and is in no way limiting. A light intensity will be denoted as "I". Values of I may be annotated with subscripts x, y (e.g. $I_{x,y}$) where x denotes the operation of the method 1500 in which the intensity may be measured, and y denotes the sensor taking the reading. For example, intensity values determined in operation 1504 may be denoted $I_{1504,126}$ for the sensors 126 and $I_{1504,165}$ for the ambient light sensor 165, respectively. The values of intensity $I_{1504}$ may be indicative of light intensity when the emergency lighting device 102 is in a non-emergency mode and may be referred to as "non-emergency intensities".

The calibration method 1500 may proceed to operation 1506 and the controller 120 interrupts the line power to the emergency lighting device 102. For example, the controller 120 may open the first test switch 122 cutting line power to the emergency lighting device 102. The emergency lighting device 102 may enter an emergency lighting mode and illuminate the light assemblies 110 and/or another light. The operation 1506 may be substantially similar to the operation 304 described herein.

The calibration method 1500 may proceed to operation 1508 and the processing element 150 monitors light output from one or more light sources 114 and/or light assembly 110, such as via sensors 126 disposed near the light sources 114. Additionally, the processing element 150 monitors the ambient light 168 via the ambient light sensor 165. The intensity values $I_{1508,126}$ and $I_{1508,165}$ may be stored such as in the memory component 154. The values of intensity 11508 may be indicative of light intensity when the emergency lighting device 102 is in an emergency mode and may be referred to as "emergency intensities".

The calibration method 1500 may proceed to operation 1510 where the controller 120 applies line power to the emergency lighting device 102. For example, the first test switch 122 may close. In response, the emergency lighting device 102 may enter a non-emergency mode and turn off the light assemblies 110. The light source 114 may remain illuminated. Operation 1510 may be substantially similar to operation 1502.

The calibration method 1500 may proceed to operation 1512 and sources of ambient light 166 are changed (e.g., reduced, increased, or removed). For example, the emergency lighting device 102 may be covered by an enclosure that blocks, reflects, or absorbs ambient light 168 that would otherwise fall on the emergency lighting device 102 or its vicinity. In another example, an ambient light source 166 may be turned off or blocked. In another example, the ambient light 168 is increased such as by opening a window, door, turning on room lights, or shining a flashlight at the 102. In some embodiments, operation 1512 is optional. The operation 1512 enables the measurement of different ambient light readings that may be used to provide an interpolation (e.g., linear, polynomial, exponential, or power series interpolation) of the contribution of ambient light to the readings taken by the sensors 126.

The calibration method 1500 may proceed to operation 1514 and the processing element 150 measures light emitted by the emergency lighting device 102 itself while in a non-emergency mode and which is detected by the sensors 126 of the emergency lighting device 102 but with the changed external ambient light 168 contributions. The processing element 150 may monitor light output from one or more light sources 114, such as via sensors 126 disposed near the light sources 114. Additionally, the processing element 150 monitors the ambient light 168 via the ambient light sensor 165. The intensity values $I_{1514,126}$ and $I_{1514,165}$ may be stored, such as in the memory component 154. The values of intensity $I_{1514}$ may be indicative of light intensity when the emergency lighting device 102 is in a non-emergency mode and a changed ambient light environment and may be referred to as "changed ambient intensities".

The calibration method 1500 may proceed to operation 1516 and the processing element 150 of the controller 150 determines an ambient light contribution (C) to the intensity readings of the sensors 126 and a baseline intensity $I_{1516,126}$ for the sensors 126. For example as shown in equation (1), a difference ∂ between the non-emergency intensities ($I_{1504}$) and darkness intensities ($I_{1514}$) is determined. The value ∂ may be determined for either or both of the sensors 126 or the ambient light sensor 165.

$$\partial = I_{1504,126} - I_{1514,126} \quad (1)$$

A baseline sensor reading (B) of the sensors 126 and/or ambient light sensor 165 may be determined as shown for example in equation (2). The baseline reading B may be indicative of the light intensity detected by the sensors 126 with the ambient light contribution removed. The baseline values may be used as described herein, such as in relation to the method 200, the operation 314, or the test method 1600.

$$B = I_{1508,126} - \partial \quad (2)$$

An ambient light contribution (C) may be expressed as a fraction, ratio, or percentage ∂ divided by the emergency intensity measured by the ambient light sensor 165, $I_{1508,165}$, as shown for example in equation (3). The ambient light contribution may be used to account for the effects of ambient light on the emergency lighting device 102, such as described with respect to FIG. 16 and test method 1600.

$$C = \partial / I_{1508,165} \quad (3)$$

An example calculation for the method 1500 is shown in Table 1, below, for illustration only and is in no way limiting. Example intensity values $I_{126}$ are shown for a sensor 126 measuring the output of light source 114, a light assembly 110, and an ambient light sensor 165. As shown for example in the intensity for the light source 114 at operation 1508, the intensity may increase, at least initially, on battery power as opposed to AC line power due to the fresh state of charge of the battery.

TABLE 1

| | Operation 1504 | Operation 1508 | Operation 1514 | ∂ | B | C |
|---|---|---|---|---|---|---|
| $I_{126}$ (light source 114) | 58.50 | 61.0 | 58.0 | 0.5 | 60.5 | 4.8% |
| $I_{126}$ (light assembly 110) | 6.00 | 83.0 | 1.0 | 5.0 | 78.0 | 48.2% |
| $I_{165}$ | 10.00 | 10.4 | 0.0 | 0.0 | 10.4 | |

Any of the values determined in operation 1516 may be stored in memory component 154 and may be used in the test method 1600.

Figure 16:
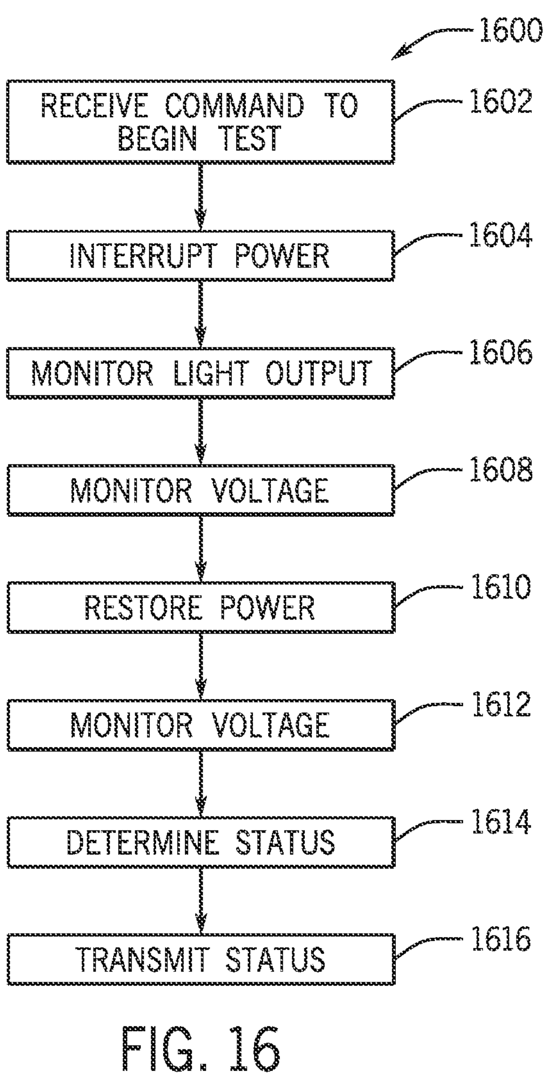
FIG. 16 illustrates a method of testing an emergency light for use with the emergency light testing system of FIGS. 13 and 14.

FIG. 16 shows an example of a test method 1600 for testing the functionality of an emergency lighting device with an ambient light sensor 165. The test method 1600 may be substantially similar to the method 300 with operations 1602, 1604, 1606, 1608, 1610, 1612, and 1616 corresponding to operations 302, 304, 306, 308, 310, 312, and 316, respectively, which are not repeated for the sake of brevity. Operation 1614 differs from that of operation 314 in how the emergency light testing system 100 determines the status of the emergency lighting device 102. In the operation 1614, the processing element 150 may read a raw intensity output ($I_{1606,126}$) of the one or more sensors 126, such as in operation 1606. The processing element 150 may determine a first adjusted intensity value ($I_{adj1}$) that accounts for the baseline value B, for example, as determined in operation 1516. See, e.g., equation (4).

$$I_{adj1} = I_{1606,126} / B \quad (4)$$

The processing element 150 may compare $I_{adj1}$ first adjusted intensity value to a predetermined threshold to determine if the first adjusted intensity value is outside of a normal range (e.g., too high, too low) and may determine that the emergency lighting device 102 has failed the test.

Also in operation 1614, the processing element 150 may determine a second adjusted intensity value ($I_{adj2}$) that accounts for the effect of ambient light on the emergency lighting device 102. See, e.g., equation (5). Equation 5 removes the ambient contribution from the raw intensity output such that the second adjusted intensity reflects the contributions to the intensity sensed by a sensor 126 from the lights (e.g., the light source 114 or the light assembly 110) as though the ambient light were not present. The processing element 150 may compare ($I_{adj2}$), the second adjusted intensity value to a predetermined threshold to determine if the second adjusted intensity value is outside of a normal range (e.g., too high, too low) and may determine that the emergency lighting device 102 has failed the test.

$$I_{adj2} = I_{1606,126} - (100 \times C) \quad (5)$$

Table 2 reflects a continued example of the calculations shown in Table 1 applied to the test method 1600 and is in no way limiting.

TABLE 2

| | $I_{1606,126}$ | $I_{adj1}$ | $I_{adj2}$ |
|---|---|---|---|
| $I_{126}$ (light source 114) | 53.2 | 88% | 48.4 |
| $I_{126}$ (light assembly 110) | 110.6 | 142% | 62.4 |

In another example, the processing element 150 may compare the intensity measured by the ambient light sensor 165 and determine that the ambient light 168 is too high to test the emergency lighting device 102 and may transmit a message indicating that the test failed, and/or may automatically reschedule a test for another time. In some examples, the test may be rescheduled for a time when ambient light conditions may be more favorable to a successful test (e.g. lower ambient light conditions, late night or early morning). In another example, the processing element 150 may periodically or continuously monitor the ambient light 168 level and initiate the test method 1600 when ambient light levels are below a threshold.

The description of certain embodiments included herein is merely exemplary in nature and is in no way intended to limit the scope of the disclosure or its applications or uses. In the included detailed description of embodiments of the present systems and methods, reference is made to the accompanying drawings which form a part hereof, and which are shown by way of illustration specific to embodiments in which the described systems and methods may be practiced. These embodiments are described in sufficient detail to enable those skilled in the art to practice presently disclosed systems and methods, and it is to be understood that other embodiments may be utilized, and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The included detailed description is therefore not to be taken in a limiting sense, and the scope of the disclosure is defined only by the appended claims.

From the foregoing it will be appreciated that, although specific embodiments of the invention have been described herein for purposes of illustration, various modifications may be made without deviating from the spirit and scope of the invention.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice.

As used herein and unless otherwise indicated, the terms "a" and "an" are taken to mean "one", "at least one" or "one or more". Unless otherwise required by context, singular terms used herein shall include pluralities and plural terms shall include the singular.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "above," and "below" and words of similar import, when used in this application, shall refer to this application as a whole and not to any particular portions of the application.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A system for testing an emergency lighting device comprising:

a node including:

a node housing coupled to a main housing of the emergency lighting device, the main housing including a light source;

a processing element disposed in the node housing and operatively coupled with a memory component;

a first test switch operatively controlled by the processing element, the first test switch configured to selectively interrupt a routine power source to the emergency device;

a light sensor in electrical communication with the processing element, the light sensor physically disposed within an emissive range of a light source of the emergency lighting device such that the light sensor individually detects a light output of the light source, wherein the light output is compared to a baseline light output of the light source by the processing element to generate a first status condition data of the light source;

wherein:

the baseline light output is captured prior to the light output and stored at the memory component;

the light output is compared to the baseline light output for the light source by the processing element to detect a change in intensity of the light source individually and over time by the light sensor;

the emergency lighting device includes the main housing formed of a plurality of walls, wherein the plurality of walls form an internal compartment; and the light source configured to be illuminated during a loss of a routine power source.

2. The system of claim 1, wherein the emergency lighting device includes:

an emergency power source disposed within the main housing;

a charging circuit disposed in the internal compartment and in electrical communication with the emergency power source and configured to charge the emergency power source from the routine power source.

3. The system of claim 1, wherein the processing element monitors a second status condition data of the emergency lighting device generated in response to the interruption of the routine power supply; and the processing element is configured to determine compliance data based on at least one of the first status condition data or the second status condition data.

4. The system of claim 3, further comprising:

a first wireless interface in communication with the processing element, the first wireless interface configured to form a network with a second wireless interface in electrical communication with a second processing element.

5. The system of claim 4, wherein the processing element is configured to transmit the compliance data by the first wireless interface to the second processing element via the network.

6. The system of claim 4, further comprising:

a third test switch operatively controlled by the second processing element, the third test switch configured to selectively interrupt a second routine power source to a second emergency device;

a second light sensor in electrical communication with the second processing element, the second light sensor disposed within an emissive range of the second light source such that the second light sensor individually detects a light output of the second light source, wherein the second light sensor generates a first status condition data of the second light source.

7. The system of claim 4, further comprising a gateway including the second processing element and the second wireless interface, wherein the gateway is configured to receive at least one of the first status condition data, the second status condition data, and the compliance data.

8. The system of claim 1, further comprising:

a second light sensor in electrical communication with the processing element, the second light sensor disposed within an emissive range of a second light source wherein:

the second light source is disposed within the main housing of the emergency device, the second light sensor individually detects a light output of the second light source, and the second light sensor generates a first status condition data of the second light source.

9. The system of claim 8, wherein the emergency lighting device comprises signage and the second light source is configured to illuminate the signage.

10. The system of claim 1, further comprising an electrical enclosure coupled to the main housing and to the node housing, wherein the node housing is coupled to the main housing by the electrical enclosure.

11. A system for testing an emergency lighting device comprising:

a node including:

a node housing retrofittable to a main housing of the emergency lighting device;

a processing element disposed in the node housing and operatively coupled with a memory component; and a light sensor in electrical communication with the processing element;

wherein:

the emergency lighting device includes an emergency power source and a light source received in the main housing, the light sensor is physically positioned within an emissive range of the light source, the light sensor individually detects a light output of the light source over time and the light output is compared to a baseline light output of the light source by the processing element to detect a change in the light intensity of the light output of the light source, the baseline light output of the output is captured prior to the light output and stored at the memory component, and the processing element generates a first status condition data of the light source responsive to the comparison of the light output and the baseline light output.

12. The system of claim 11, wherein:

a second light source is external to the emergency lighting device, and a second light sensor is positioned on the second light source.

13. The system of claim 11, further comprising a first test switch operatively controlled by the processing element, the first test switch configured to selectively interrupt the routine power source to the emergency device, wherein the interruption of the routine power source causes the emergency device to illuminate the light source.

14. The system of claim 11, the node further comprising an indicator light source providing a status of the node or emergency lighting device.

* * * * *